(12) United States Patent
Cho et al.

(10) Patent No.: US 10,803,805 B2
(45) Date of Patent: Oct. 13, 2020

(54) DISPLAY PANEL AND DISPLAY DEVICE USING THE SAME FOR WIRELESS SIGNAL TRANSMISSION

(71) Applicant: a.u. Vista, Inc., Milpitas, CA (US)

(72) Inventors: Wei-Min Cho, Hsinchu (TW);
Yu-Sheng Huang, Hsinchu (TW);
Pin-Miao Liu, Hsinchu (TW);
Ching-Yi Hsu, Hsinchu (TW)

(73) Assignee: A.U. VISTA, INC., Milpitas, CA (US)

( * ) Notice: Subject to any disclaimer, the term of this patent is extended or adjusted under 35 U.S.C. 154(b) by 58 days.

(21) Appl. No.: 16/281,304

(22) Filed: Feb. 21, 2019

(65) Prior Publication Data
US 2020/0020751 A1 Jan. 16, 2020

Related U.S. Application Data
(60) Provisional application No. 62/696,031, filed on Jul. 10, 2018.

(51) Int. Cl.
*G09G 3/22* (2006.01)
*G09G 3/3258* (2016.01)
(Continued)

(52) U.S. Cl.
CPC ......... *G09G 3/3258* (2013.01); *G02F 1/1368* (2013.01); *G02F 1/13452* (2013.01); *G02F 1/136286* (2013.01); *G09G 3/2003* (2013.01); *G09G 3/32* (2013.01); *G09G 3/3614* (2013.01); *G09G 3/3659* (2013.01); *G09G 3/3677* (2013.01); *H01L 25/167* (2013.01); *H01L 27/1218* (2013.01); *H01L 27/326* (2013.01); *H01L 27/3211* (2013.01); *H01L 27/3276* (2013.01); *H01Q 1/24* (2013.01); *H05K 1/0213* (2013.01); *G09G 2300/0408* (2013.01); *G09G 2300/0426* (2013.01); *G09G 2300/0439* (2013.01); *G09G 2300/0814* (2013.01);
(Continued)

(58) Field of Classification Search
None
See application file for complete search history.

(56) References Cited

U.S. PATENT DOCUMENTS 6,362,737 B1 3/2002 Rodgers et al.
9,190,738 B2 11/2015 Alexopoulos et al.
(Continued)

*Primary Examiner* — Carl Adams
(74) *Attorney, Agent, or Firm* — Tim Tinkang Xia, Esq.; Locke Lord LLP

(57) ABSTRACT

A display panel includes a pixel structure corresponding to a display area, and a receiver antenna structure disposed on the pixel structure. The receiver antenna structure includes multiple receiver antennas providing first signals to the pixels of the pixel structure. Each receiver antenna corresponds to at least one pixel, and has an induced decibel (dB). For each receiver antenna, the induced dB is determined by multiple parameters of the receiver antenna, such as a winding number of the receiver antenna; an outer diameter of the receiver antenna; an inner diameter of the receiver antenna; a line pitch of the receiver antenna; a line width of the receiver antenna; and a line thickness of the receiver antenna. The induced dB of at least one of the receiver antennas is greater than the induced dB of other receiver antennas. The display panel may be used in a tiled micro LED display apparatus.

20 Claims, 18 Drawing Sheets

(51) Int. Cl.

| | | |
|---|---|---|
| | *H01L 27/12* | (2006.01) |
| | *H05K 1/02* | (2006.01) |
| | *H01Q 1/24* | (2006.01) |
| | *G02F 1/1345* | (2006.01) |
| | *G02F 1/1362* | (2006.01) |
| | *G02F 1/1368* | (2006.01) |
| | *G09G 3/32* | (2016.01) |
| | *G09G 3/36* | (2006.01) |
| | *H01L 25/16* | (2006.01) |
| | *G09G 3/20* | (2006.01) |
| | *H01L 27/32* | (2006.01) |

(52) U.S. Cl.
CPC ............ *G09G 2300/0885* (2013.01); *G09G 2320/0219* (2013.01); *G09G 2370/16* (2013.01); *H01L 27/1255* (2013.01)

(56) References Cited

U.S. PATENT DOCUMENTS

2010/0033489 A1* 2/2010 Elliott .................... G09G 5/363
345/522
2018/0190182 A1* 7/2018 Li ............................ G09G 3/22

\* cited by examiner

DISPLAY PANEL AND DISPLAY DEVICE USING THE SAME FOR WIRELESS SIGNAL TRANSMISSION

CROSS-REFERENCE TO RELATED PATENT APPLICATION

This non-provisional application claims priority to and the benefit of, pursuant to 35 U.S.C. § 119(e), U.S. provisional patent application Ser. No. 62/696,031 filed Jul. 10, 2018. The disclosure of the above application is incorporated herein in its entirety by reference.

FIELD

The disclosure relates generally to display technology, and more particularly to a display device having an antenna layer design for illuminance and transmission decibel adjustment.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

With larger display resolution and size are required, the micro light emitting diode (LED) display apparatus has become one of the most popular display panels for high light emitting efficiency. Generally, a display panel may include a peripheral non-display area, which is reserved for a plurality of integrated circuits (ICs), as the data drivers that provide data signals to the pixels of the display panel. In order to reduce or eliminate the peripheral non-display area, wireless transmission technology may be used to transmit the data signals, thus achieving high speed data transmission. However, since a larger display device is required, a severe voltage drop by current (also known as the "IR drop") problem might occur in the signal transmission along a signal line.

Therefore, a heretofore unaddressed need exists in the art to address the aforementioned deficiencies and inadequacies.

SUMMARY

One aspect of the disclosure relates to a display panel, including: a pixel structure corresponding to a display area, comprising a plurality of pixels arranged in an array having M columns and N rows, wherein M and N are positive integers; and a receiver antenna structure disposed on the pixel structure, configured to provide first signals to the pixels, wherein the receiver antenna structure comprises a plurality of receiver antennas, each of the receiver antennas corresponds to at least one of the M columns and at least one of the N rows of the pixels and has an induced decibel (dB); wherein for each of the receiver antennas, the induced dB is determined by a plurality of parameters of the receiver antenna, and the parameters include: a winding number of the receiver antenna; an outer diameter of the receiver antenna; an inner diameter of the receiver antenna; a line pitch of the receiver antenna; a line width of the receiver antenna; and a line thickness of the receiver antenna; wherein the induced dB of at least one of the receiver antennas is greater than the induced dB of other ones of the receiver antennas.

In certain embodiments, the pixel structure further comprises a plurality of data lines, each of the receiver antennas is electrically connected to one of the data lines, and each of the pixels in a same column of the M columns of the pixel array is connected to a same one of the data lines.

In certain embodiments, each of the receiver antennas has an outer feeding end and an inner feeding end, and each of the receiver antennas is electrically connected to the corresponding one of the data lines at one of the outer feeding end and the inner feeding end thereof.

In certain embodiments, each of the receiver antennas has an identical outer diameter, an identical line pitch, an identical line width and an identical line thickness, and the induced dB of each of the receiver antennas is determined by the winding number of each of the receiver antennas; and the winding number of at least one of the receiver antennas is greater than the winding number of other ones of the receiver antennas.

In certain embodiments, the pixel structure further comprises a plurality of gate lines, each of the pixels in a same row of the N rows of the pixel array is electrically connected to a same one of the gate lines, and each of the gate lines is electrically connected to a gate driver; and the receiver antennas comprise a plurality of first receiver antennas corresponding to the pixels being electrically connected to the gate lines at locations away from the gate driver and a plurality of second receiver antennas corresponding to the pixels being electrically connected to the gate lines at locations close to the gate driver, and the winding number of each of the first receiver antennas is greater than the winding number of each of the second receiver antennas.

In certain embodiments, the display panel further includes a LED chip layer comprising a plurality of LED chips arranged in a LED array, wherein each of the pixels comprises three subpixels, comprising a red (R) subpixel, a green (G) subpixel and a blue (B) subpixel, and each of the LED chips corresponds to one of the subpixels of the pixels.

In certain embodiments, the receiver antennas comprises a plurality of first receiver antennas corresponding to the R subpixels of the pixels, a plurality of second receiver antennas corresponding to the G subpixels of the pixels, and a plurality of third receiver antennas corresponding to the B subpixels of the pixels; and the winding number of each of the third receiver antennas is greater than the winding number of each of the first receiver antennas and the second receiver antennas.

In certain embodiments, the winding number of each of the first receiver antennas is greater than the winding number of each of the second receiver antennas.

In certain embodiments, the winding number of each of the second receiver antennas is greater than the winding number of each of the first receiver antennas.

In certain embodiments, the receiver antennas comprises a plurality of first receiver antennas corresponding to the R subpixels of the pixels, a plurality of second receiver antennas corresponding to the G subpixels of the pixels, and a plurality of third receiver antennas corresponding to the B subpixels of the pixels; and for the first, second and third receiver antennas corresponding to the subpixels of a same pixel, the inner diameter of the third receiver antenna is greater than the outer diameter of the first receiver antenna and the outer diameter of the second receiver antenna.

In certain embodiments, for the first, second and third receiver antennas corresponding to the subpixels of the same pixel, the winding number of the third receiver antenna is greater than the winding number of each of the first receiver antenna and the second receiver antenna.

In certain embodiments, for the first, second and third receiver antennas corresponding to the subpixels of the same pixel, the inner diameter of the first receiver antenna is greater than the outer diameter of the second receiver antenna.

In certain embodiments, for the first, second and third receiver antennas corresponding to the subpixels of the same pixel, the inner diameter of the first receiver antenna is greater than the outer diameter of the second receiver antenna.

In certain embodiments, each of the receiver antennas has an identical outer diameter, an identical inner diameter, an identical line pitch, an identical line width and an identical winding number, and the induced dB of each of the receiver antennas is determined by the line thickness of each of the receiver antennas; and the line thickness of at least one of the receiver antennas is greater than the line thickness of other ones of the receiver antennas.

In another aspect of the disclosure, a tiled micro light-emitting diode (LED) display apparatus includes: a plurality of micro LED display panels arranged in tiles, wherein gaps are formed between adjacent ones of the micro LED display panels; wherein each of the micro LED display panels comprises: a pixel structure corresponding to a display area, comprising a plurality of pixels arranged in a pixel array having M columns and N rows, wherein M and N are positive integers; a micro LED chip layer comprising a plurality of micro LED chips arranged in a micro LED array, wherein each of the micro LED chips corresponds to one of the pixels; and a receiver antenna structure disposed on the pixel structure, configured to provide data signals to the pixels, wherein the receiver antenna structure comprises a plurality of receiver antennas arranged in an antenna array, and each of the receiver antennas corresponds to at least one of the M columns and at least one of the N rows of the pixels and has an induced decibel (dB); wherein for each of the receiver antennas, the induced dB is determined by a plurality of parameters of the receiver antenna; wherein for each of the micro LED display panels, the receiver antennas in the antenna array comprises first receiver antennas located near the gaps and second receiver antennas located away from the gaps, and the induced dB of each of the first receiver antennas is greater than the induced dB of each of the second receiver antennas.

In certain embodiments, the parameters includes: a winding number of the receiver antenna; an outer diameter of the receiver antenna; an inner diameter of the receiver antenna; a line pitch of the receiver antenna; a line width of the receiver antenna; and a line thickness of the receiver antenna.

In certain embodiments, each of the receiver antennas has an identical outer diameter, an identical line pitch, an identical line width and an identical line thickness, and the induced dB of each of the receiver antennas is determined by the winding number of each of the receiver antennas; and the winding number of each of the first receiver antennas is greater than the winding number of each of the second receiver antennas.

In certain embodiments, for each of the micro LED display panels, the first receiver antennas are the receiver antennas located on at least one outermost column or located on at least one outermost row of the antenna array adjacent to the gaps.

In certain embodiments, for each of the micro LED display panels, the pixel structure further comprises a plurality of data lines, each of the receiver antennas is electrically connected to one of the data lines, and each of the pixels in a same column of the M columns of the pixel array is connected to a same one of the data lines.

In certain embodiments, each of the receiver antennas has an outer feeding end and an inner feeding end, and each of the receiver antennas is electrically connected to the corresponding one of the data lines at one of the outer feeding end and the inner feeding end thereof.

In certain embodiments, each of the receiver antennas has an identical outer diameter, an identical inner diameter, an identical line pitch, an identical line width and an identical winding number, and the induced dB of each of the receiver antennas is determined by the line thickness of each of the receiver antennas; and the line thickness of at least one of the receiver antennas is greater than the line thickness of other ones of the receiver antennas.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION OF THE DISCLOSURE

Figure 1A:
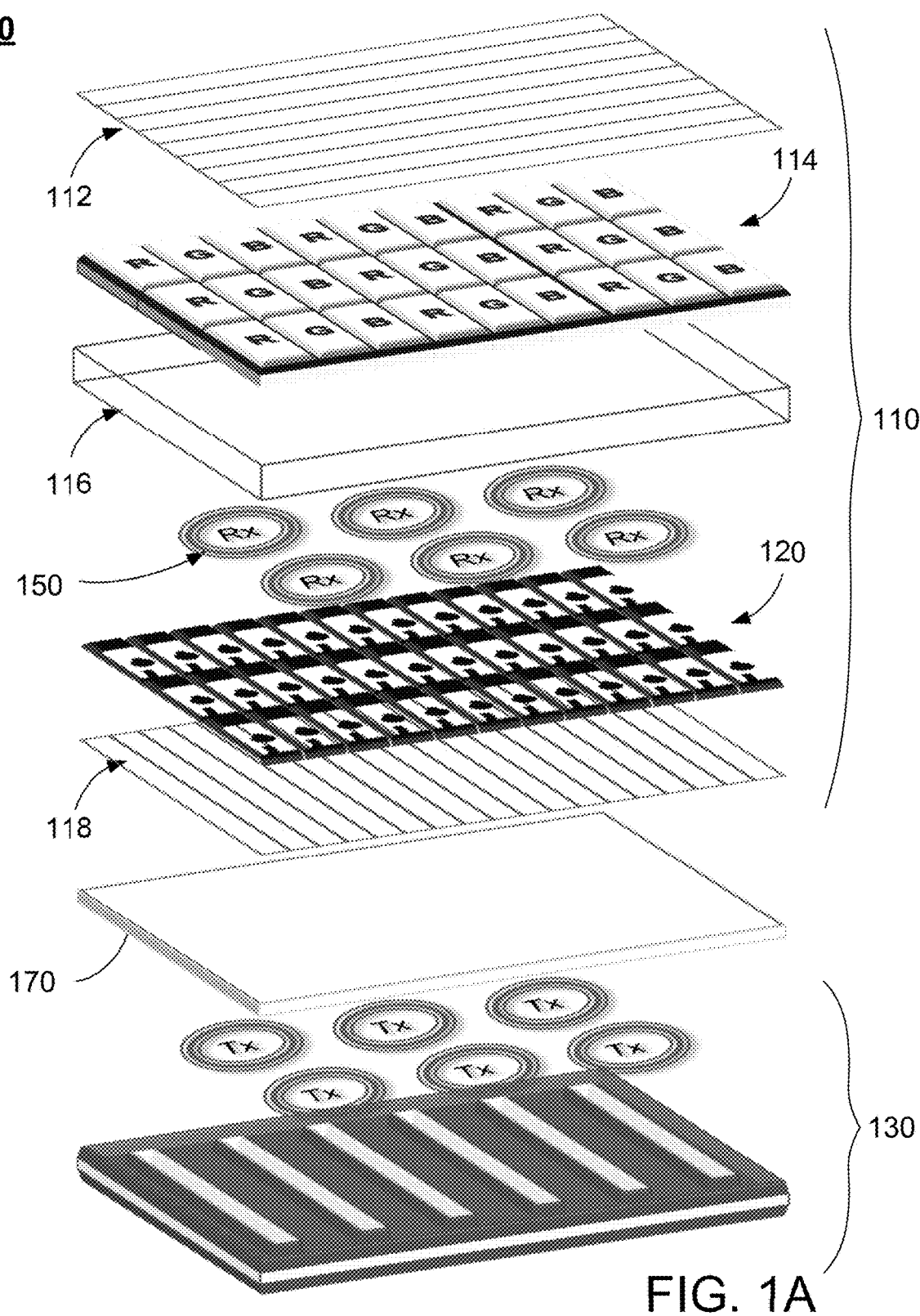
FIG. 1A schematically shows an exploded view of a display panel of a display device according to certain embodiments of the present disclosure.

The present disclosure will now be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and in no way limits the scope and meaning of the invention or of any exemplified term. Likewise, the invention is not limited to various embodiments given in this specification.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom", "upper" or "top", and "left" and "right", may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper", depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

The description will be made as to the embodiments of the present disclosure in conjunction with the accompanying drawings. In accordance with the purposes of this disclosure, as embodied and broadly described herein, this disclosure, in certain aspects, relates to a display panel and a display device using the same for wireless data transmission.

As described above, a display panel may adopt a wireless transmission mechanism to achieve high speed data transmission. In one example, magnetic coupling antennas may be used as transmitters and receivers to facilitate wireless transmission. For example, when a transmitter antenna Tx is provided with a current, the transmitter antenna Tx may generate a magnetic field, which causes a corresponding receiver antenna Rx to generate an induced current. Thus, the signal is transmitted from the transmitter antenna Tx to the corresponding receiver antenna Rx. However, since a larger display device is required, a severe voltage drop by current (also known as the "IR drop") problem might occur in the data line transmission. Therefore, the present disclosure proposes a block driving mechanism to solve the IR drop problem by separating the display panel into different block zones and driving each block zone individually using different receiver antennas. Further, a tiled display apparatus is also proposed.

FIG. 1A schematically shows an exploded view of a display panel according to certain embodiments of the present disclosure. As shown in FIG. 1A, the display panel 100 is a color liquid crystal display (LCD) panel, which includes a display cell 110, a transmitter antenna structure 130, a receiver antenna structure 150 and a backlight module 170. The display cell 110 includes, from the image display side (top side of FIG. 1A) toward a backlight side (bottom side of FIG. 1A), a first polarizer 112, a color filter layer 114, a liquid crystal layer 116, a thin-film transistor (TFT) array 120 and a second polarizer 118. The receiver antenna structure 150 is formed by a plurality of receiver antennas Rx and is disposed on the TFT array 120. The transmitter antenna structure 150 is formed by a plurality of transmitter antennas Tx and is disposed on the backlight module 170, such that a distance exists between the transmitter antenna structure 130 and the receiver antenna structure 150 to facilitate high speed wireless data transmission between the transmitter antenna structure 130 and the receiver antenna structure 150.

In the display cell 110, the TFT array 120, the liquid crystal layer 116 and the color filter layer 114 correspondingly define a pixel structure, which corresponds to a display area of the display panel 100. Specifically, the pixel structure includes a plurality of pixels arranged in an array having M columns and N rows, where M and N are positive integers. For each pixel of the pixel structure, a corresponding TFT in the TFT array 120 and a corresponding set of color filters in the color filter layer 114 are provided.

In certain embodiments, the display panel 100 may include other layers or structures not shown in FIG. 1A. For example, multiple insulating films or layers may be provided in the pixel structure (i.e., the TFT array 120, the liquid crystal layer 116 and the color filter layer 114).

Figure 1B:
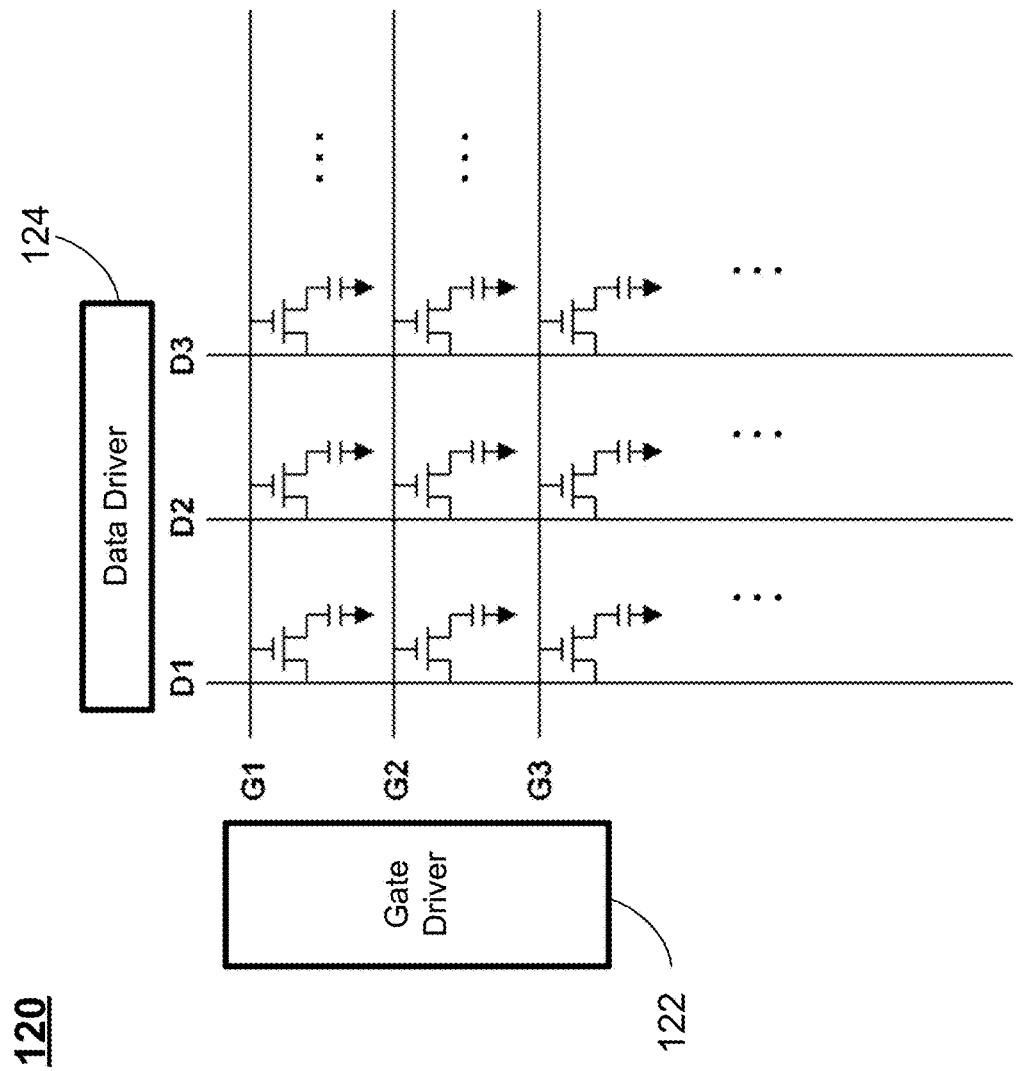
FIG. 1B schematically shows a part of a TFT array according to certain embodiments of the present disclosure.

FIG. 1B schematically shows a part of a TFT array according to certain embodiments of the present disclosure. As shown in FIG. 1B, the TFT array 120 includes a plurality of TFTs arranged in an array, where each of the TFT corresponds to a pixel of the pixel structure. In other words, for the pixel structure that includes a plurality of pixels arranged in an array having M columns and N rows, the TFT array 120 also includes a plurality of TFTs arranged in an array having M columns and N rows. Further, a plurality of data lines D1, D2, D3 . . . and a plurality of gate lines G1, G2, G3 . . . are provided in the pixel structure. Each of the data lines D1, D2, D3 is electrically connected to the sources of the TFTs in a corresponding column, and each of the gate lines G1, G2, G3 is electrically connected to the gates of the TFTs in a corresponding row. A gate driver 122 is connected to the gate lines G1, G2, G3 for providing gate signals to the gate lines, and a data driver 124 is connected to the data lines D1, D2, D3 for providing data signals to the data lines. In certain embodiments, the gate driver 122 and the data driver 124 are respectively provided at the border area of the display panel. In certain embodiments, multiple gate drivers 122 may be provided. In certain embodiments, multiple data drivers 124 may be provided.

Figure 2C:
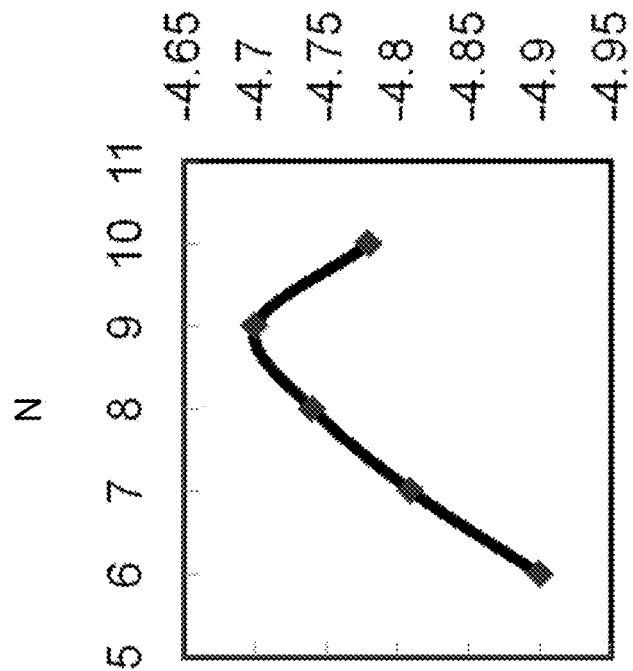
FIG. 2C shows a chart illustrating a relationship between a winding number of an antenna to an induced dB of the antenna according to certain embodiments of the present disclosure.
Figure 2A:
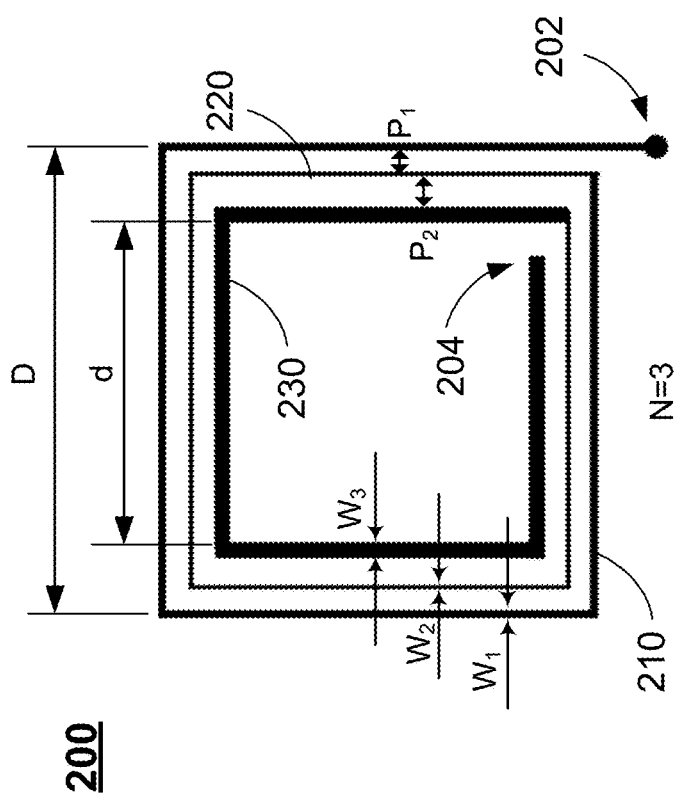
FIG. 2A schematically shows a top view of an antenna according to certain embodiments of the present disclosure.
Figure 2B:
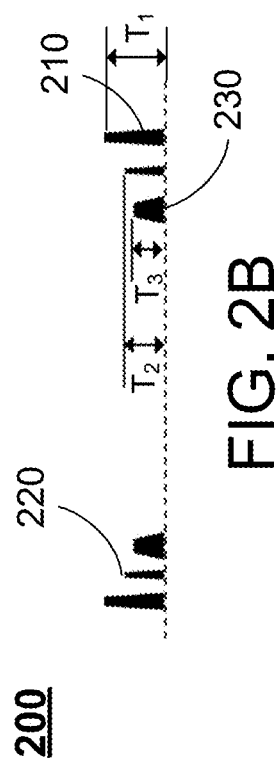
FIG. 2B schematically shows a side sectional view of an antenna according to certain embodiments of the present disclosure.

FIGS. 2A and 2B schematically show an antenna according to certain embodiments of the disclosure. Specifically, the antenna 200 as shown in FIGS. 2A and 2B can be used as a receiver antenna Rx in the receiver antenna structure 150 as shown in FIG. 1A. As shown in FIG. 2A, the antenna 200 is winding from an outer feeding end 202 inward to an inner feeding end 204 in a counter-clockwise direction. In certain embodiments, the winding direction of the antenna 200 can be either clockwise or counter-clockwise.

Generally, the transmission characteristics of an antenna 200 may be determined by several parameters related to the structural limitations of the antenna 200. Examples of these parameters include, without being limited thereto, a winding number N of the antenna 200, an outer diameter D of the antenna 200, an inner diameter d of the antenna 200, a line pitch P of the antenna, a line width W of the antenna 200, and a line thickness T of the antenna 200. For example, as shown in FIG. 2A, the antenna 200 includes 3 turns of wires, including an outermost turn 210, a middle turn 220 and an innermost turn 230. Thus, for the antenna 200, the winding number N=3, the outer diameter D is the outer diameter of the outermost turn 210, and the inner diameter d is the inner diameter of the innermost turn 230. Further, as shown in FIGS. 2A and 2B, the line pitch P, the line width W and the line thickness T of the antenna 200 are all variable throughout the 3 turns of wires. For example, the outermost turn 210 has a line width $W_1$ and a line thickness $T_1$, the middle turn 220 has a line width $W_2$ and a line thickness $T_2$, and the innermost turn 230 has a line width $W_3$ and a line thickness $T_3$, where $W_3>W_1>W_2$ and $T_1>T_2>T_3$. A first line pitch $P_1$ exists between the outermost turn 210 and the middle turn 220, and a second line pitch $P_2$ exists between the innermost turn 230 and the middle turn 220, where $P_2>P_1$.

It should be noted that the structural limitations of the antenna 200 as shown in FIGS. 2A and 2B are merely provided as an embodiment. In certain embodiments, the winding number N of the antenna 200 may be in a range between 9 and 16. In certain embodiments, the line width W of the antenna 200 may be in a range between 30 μm and 50 μm, and the line pitch P of the antenna 200 may be in a range between 10 μm and 30 μm. In certain embodiments, the outer diameter D of the antenna 200 may be in a range between 3 mm and 30 mm. In this case, if the line pitch P, the line width W of the antenna 200 are constant throughout the whole antenna 200, the inner diameter d of the antenna 200 may be calculated by the formula (1).

$$d=D-2*(N*(W+P)) \quad (1)$$

In certain embodiments, the transmission characteristics of an antenna 200 may be described in the form of an induced decibel (dB), which reflects the transmission performance of the antenna 200. The induced dB of the antenna 200 may be determined correspondingly with one or more of the above-mentioned parameters of the antenna 200. In the wireless transmission field, the value of the induced dB of an antenna indicates a ratio Rx/Tx, which refers to the ratio of the receiver antenna Rx to the transmitter antenna Tx of the antenna. For example, if a power ratio of the Rx/Tx is X, the amplitude ratio of the Rx/Tx is $(X)^{1/2}$, and the induced dB of the antenna is $10*\log_{10} X$. Generally, an antenna having an induced dB that is greater than −10 dB indicates an acceptable performance for the wireless transmission of the antenna, and an antenna having an induced dB that is close to 0 dB indicates an excellent performance (i.e., minimum transmission loss) for the wireless transmission of the antenna.

The winding number N of an antenna is one of the significant parameters affecting the induced dB of the antenna. FIG. 2C shows a chart of a winding number to an induced dB of the antenna according to certain embodiments of the disclosure. Specifically, the chart in FIG. 2C shows a set of antennas with different winding numbers N, while substantially maintaining an identical outer diameter D, an identical line width, an identical line pitch and an identical line thickness. As shown in FIG. 2C, the induced dB of the antenna is in a range between −4.95 and −4.7 when the winding number N of the antenna is in the range of N=6-10, and at the winding number N=9, the induced dB of the antenna reaches a maximum value of about −4.7 dB. In other words, when N<10, there is a trend that increasing the winding number N of an antenna will result in a better induced dB of the antenna.

Figure 3A:
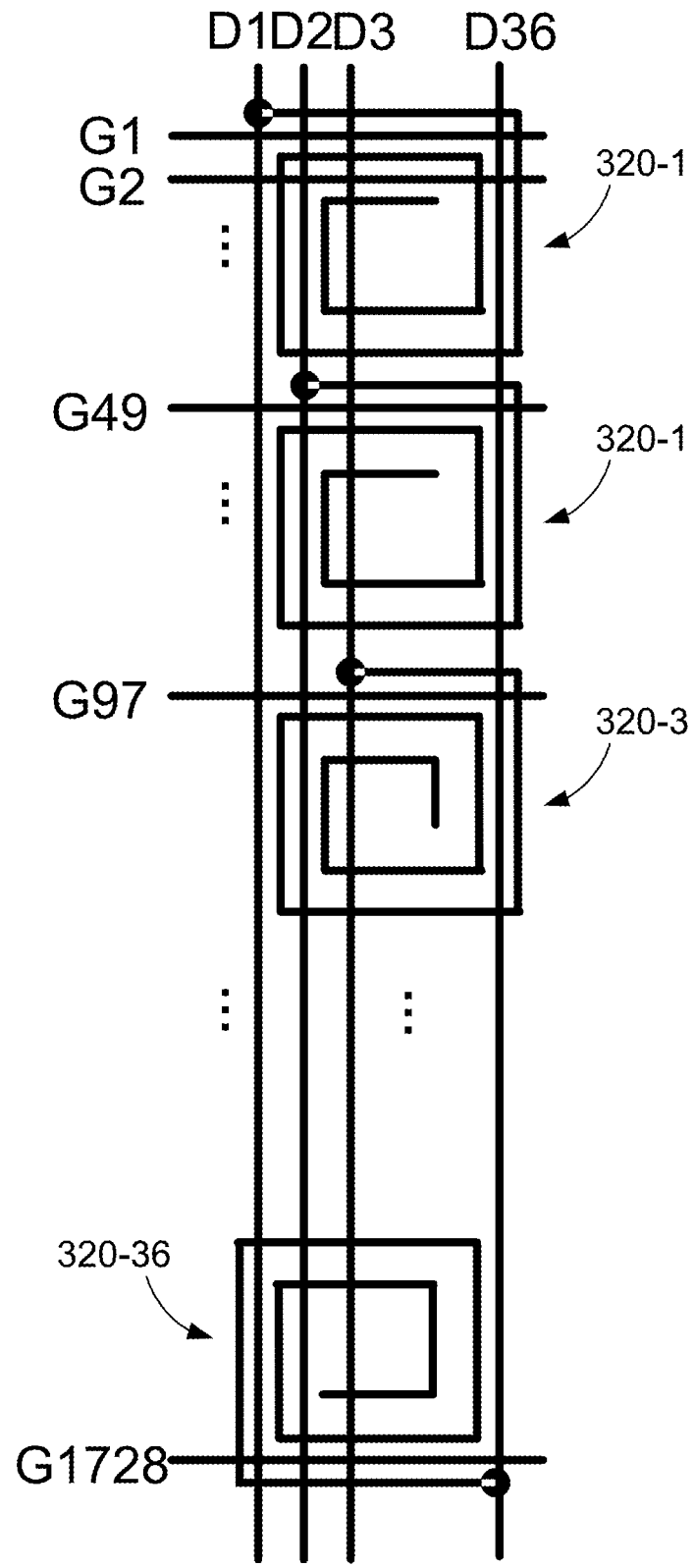
FIG. 3A schematically shows the connections between a row of receiver antennas in a receiver antenna structure and corresponding data lines in the pixel structure according to certain embodiments of the present disclosure.

FIG. 3A schematically shows the connections between a row of receiver antennas in a receiver antenna structure and corresponding data lines according to certain embodiments of the present disclosure. As shown in FIG. 3A, the pixel structure 300 includes 36 data lines D1 to D36 from left to right, and 1728 gate lines G1 to G1728 from top to bottom. Correspondingly, the receiver antenna structure includes 36 receiver antennas 320-1 to 320-36 arranged in a column. Each of the 36 data lines D1 to D36 is electrically connected to a corresponding one of the 36 receiver antennas 320-1 to 320-36 at the outer feeding end, and the inner feeding end of each of the 36 receiver antennas 320-1 to 320-36 is grounded. In other words, the number of the receiver antennas in a column is the same as the number of the corresponding data lines.

Figure 3B:
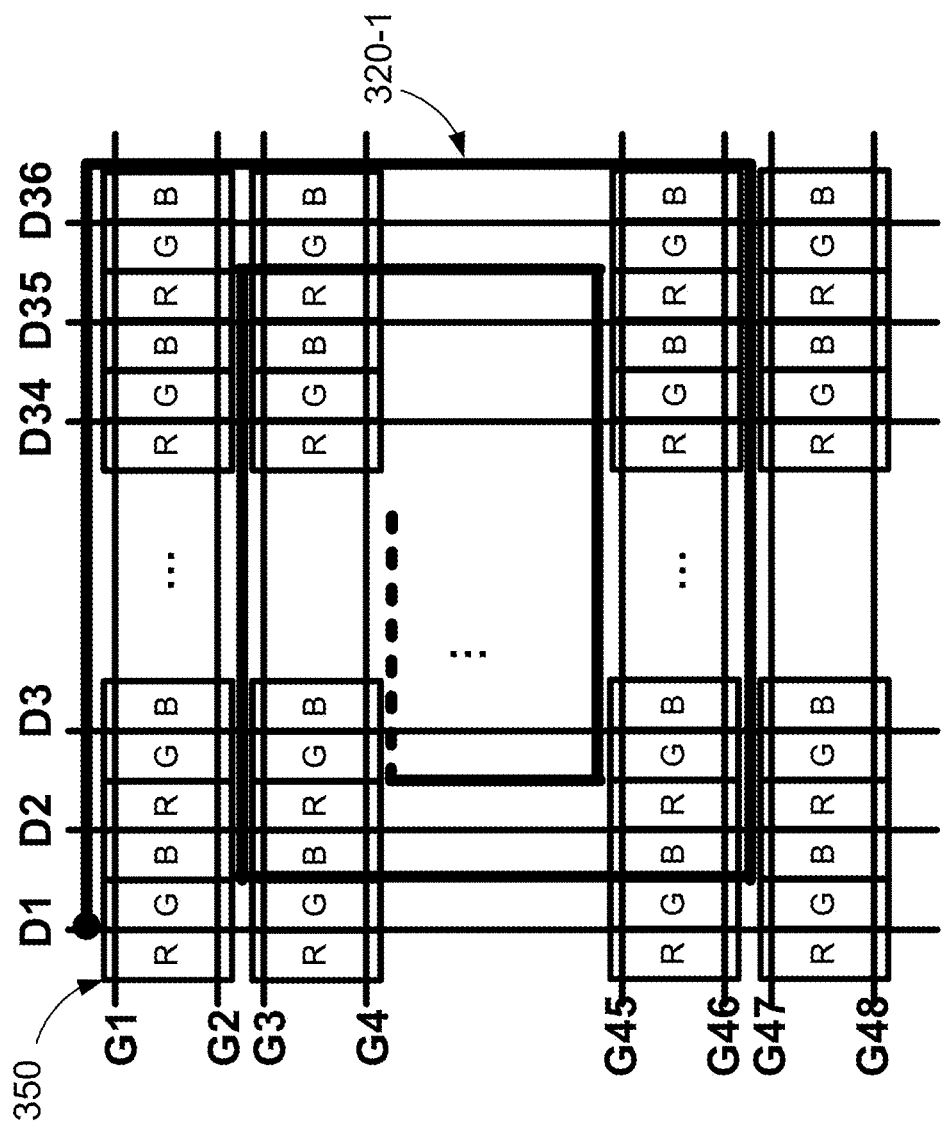
FIG. 3B schematically shows the location of one of the receiver antennas as shown in FIG. 3A according to certain embodiments of the present disclosure.

FIG. 3B schematically shows the location of one of the receiver antennas as shown in FIG. 3A. As shown in FIG. 3B, the horizontal segments of the receiver antenna 320-1 are respectively located between gate lines G1 to G48 and between two consecutive rows of the color filters 350, and the vertical segments of the receiver antenna 320-1 are respectively located between the data lines D1 to D36 and the color filters 350, such that no segments of the receiver antenna 320-1 directly overlap with the data lines, the gate lines and the color filters.

As shown in FIG. 3A, each of the receiver antennas 320-1 to 320-36 is electrically connected to the corresponding data lines D1 to D36 at the outer feeding end of the receiver antenna. In certain embodiments, each of the receiver antennas can be electrically connected to the corresponding data line at either one of the outer feeding end and the inner feeding end thereof. In this case, the other of the outer feeding end and the inner feeding end of the receiver antenna which is not being electrically connected to the corresponding data line may be grounded.

Further, as shown in FIG. 3A, the receiver antennas 320-1 to 320-36 are electrically connected to the corresponding data lines D1 to D36. In certain embodiments, the receiver antennas can be electrically connected to corresponding signal lines, where the signal lines can be data lines, gate lines or other signal lines of the display panel.

Figure 3C:
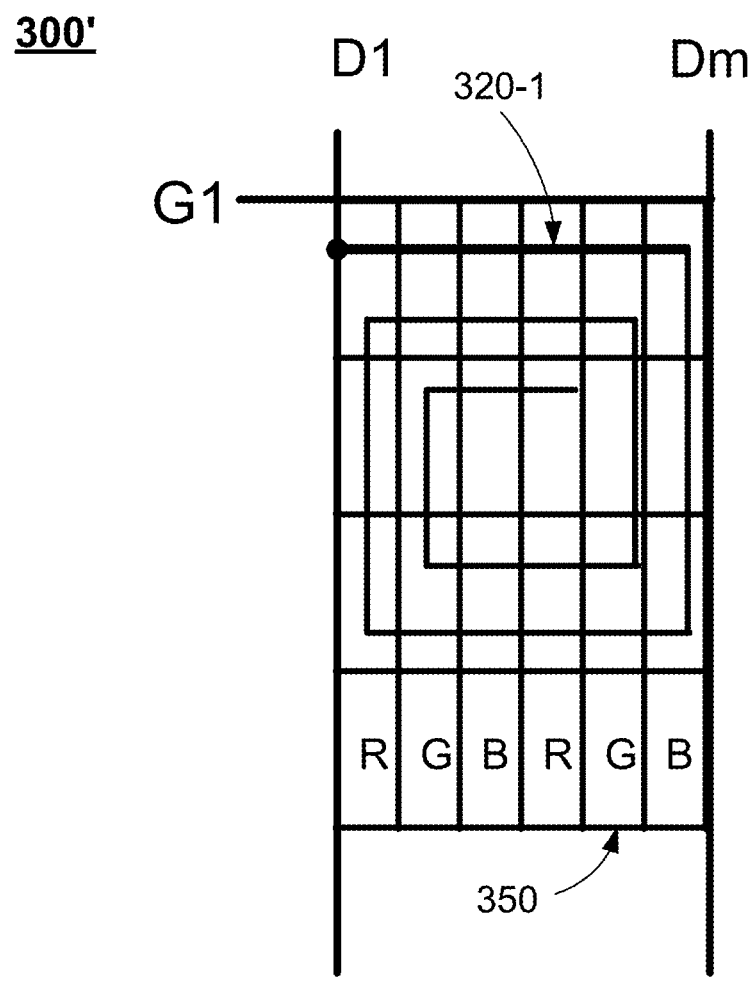
FIG. 3C schematically shows the location of one of the receiver antennas as shown in FIG. 3A according to certain embodiments of the present disclosure.

Moreover, as shown in FIG. 3B, no segments of the receiver antenna directly overlap with the color filters. However, in certain embodiments, the segments of the receiver antenna may overlap with the color filters. For example, FIG. 3C schematically shows the location of one of the receiver antennas as shown in FIG. 3A according to certain embodiments of the present disclosure. As shown in FIG. 3C, the horizontal segments of the receiver antenna 320-1 are respectively located to overlap with the color filters 350, and the vertical segments of the receiver antenna 320-1 are respectively located to overlap with the color filters 350.

Figure 4A:
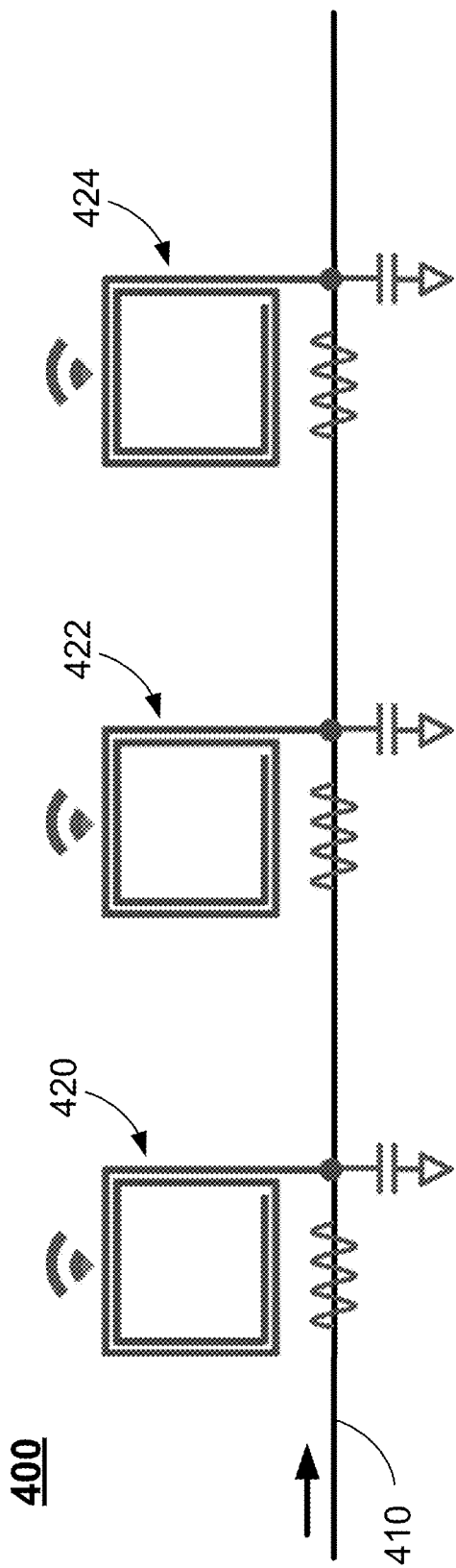
FIG. 4A schematically shows a plurality of antennas having an identical winding number in a receiver antenna structure according to certain embodiments of the present disclosure.
Figure 4B:
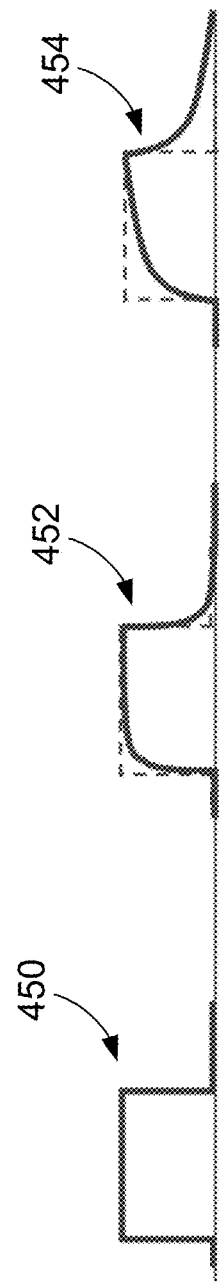
FIG. 4B schematically shows the signals transmitted by the antennas as shown in FIG. 4A.

As stated above, in a larger display device, a severe voltage drop by current (also known as the "IR drop") problem might occur in the signal transmission along a signal line, such as the data line or the gate line. For example, FIG. 4A schematically shows a plurality of antennas having an identical winding number in a receiver antenna structure according to certain embodiments of the present disclosure, and FIG. 4B schematically shows the signals transmitted by the antennas as shown in FIG. 4A. As shown in FIG. 4A, the receiver antenna structure 400 includes three receiver antennas 420, 422 and 424 sequentially connected to a gate line 410, where the gate signal is transmitted from left to right. In other words, the gate driver (not shown) being connected to the gate line 410 should be located at the left side of FIG. 4A. It should be noted that the three receiver antennas 420, 422 and 424 are identical antennas, where each receiver antenna has the same winding number N=2, an identical outer diameter, an identical line pitch, an identical line width and an identical line thickness. Thus, the induced dB for each of the three receiver antennas 420, 422 and 424 are also substantially identical. Theoretically, the gate signal being transmitted through the gate line 410 should be a square wave pulse, such as the pulse 450 as shown in FIG. 4B. However, due to the IR drop problem, the gate signal being transmitted through the gate line 410 may be affected due to the loading of the gate line 410, which results in the pulse wave of the actual gate signals being transmitted to the antennas 422 and 424 to significantly deform, thus becoming the deformed wave shapes 452 and 454 as shown in FIG. 4B and causing a severe voltage drop of the actual gate signals.

Figure 4C:
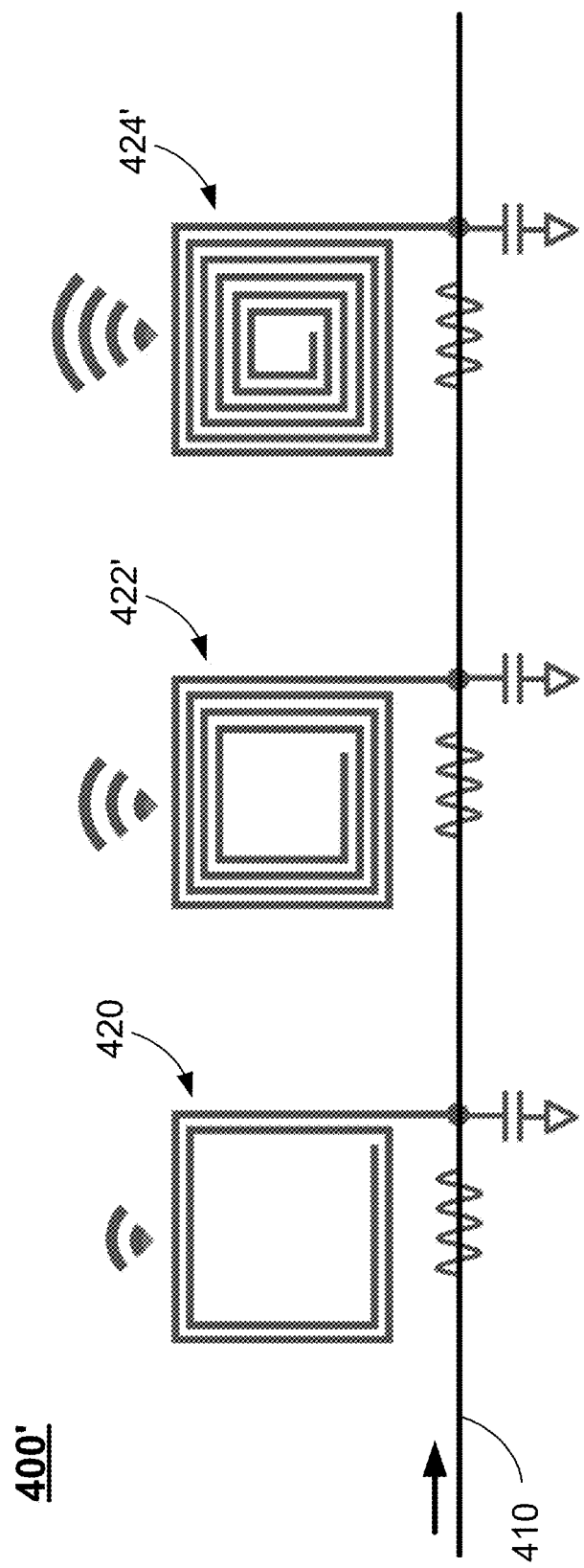
FIG. 4C schematically shows a plurality of antennas having different winding numbers in a receiver antenna structure according to certain embodiments of the present disclosure.

In certain embodiments, the IR drop problem as shown in FIGS. 4A and 4B may be resolved by changing the structures of the receiver antennas Rx of the receiver antenna structure 170 as shown in FIG. 1. For example, some of the receiver antennas Rx located close to the tail end of a corresponding gate line may sustain heavier loadings, and these receiver antennas Rx with heavier loadings may be adjusted to increase the induced dB thereof, such that the induced dB of each of these receiver antennas Rx is greater than the induced dB of other ones of the receiver antennas Rx. For example, FIG. 4C schematically shows a plurality of antennas having different winding numbers in a receiver antenna structure according to certain embodiments of the present disclosure. As shown in FIG. 4C, the receiver antenna structure 400' has a similar antenna structure to the receiver antenna structure 400 as shown in FIG. 4A, with the only difference being that the winding number of the receiver antennas 422' and 424' have been increased, while other parameters of the receiver antennas 420, 422' and 424', such as the outer diameter, line pitch, line width and line thickness, remain identical. Specifically, in comparison to the receiver antenna 420, which is electrically connected to the gate line 410 at a location closer to the gate driver (which is on the left side of FIG. 4C), the receiver antenna 422' and 424' are electrically connected to the gate line 410 at a location away from the gate driver. For the receiver antenna 422', N=4, and for the receiver antenna 424', N=6. Thus, the induced dB for the 3 receiver antennas 420, 422' and 424' will be increased sequentially, such that the induced dB of the receiver antenna 422' is greater than the induced dB of the receiver antenna 420, and the induced dB of the receiver antenna 424' is greater than the induced dB of the receiver antenna 422'. In this case, the IR drop problem caused by the heavy loading toward the end of the gate line 410 can be compensated.

In the embodiment as shown in FIG. 4C, the receiver antennas as disclosed are used in transmission of gate signals. However, in certain embodiments, the receiver antennas as disclosed can be used in transmission of other signals, such as the data signals for data lines, the scan signals for scan lines, gate control signals for the gate lines, or other types of signals based on the need of the display panel. Further, FIG. 4C only shows three receiver antennas 420', 422' and 424' along a gate line 410. However, in certain embodiments, a row of multiple receiver antennas may be provided to be connected to a signal line (or multiple signal lines), and the number of receiver antennas in a row may be determined based on the design of the pixel structure of the display panel. Moreover, the three receiver antennas 420', 422' and 424' as shown in FIG. 4C are provided merely as one embodiment. In certain embodiments, the winding numbers of the receiver antennas 420', 422' and 424' may be different from those as described above, as long as the winding number of each of the receiver antennas 420', 422' and 424' is less than 10.

Figure 5A:
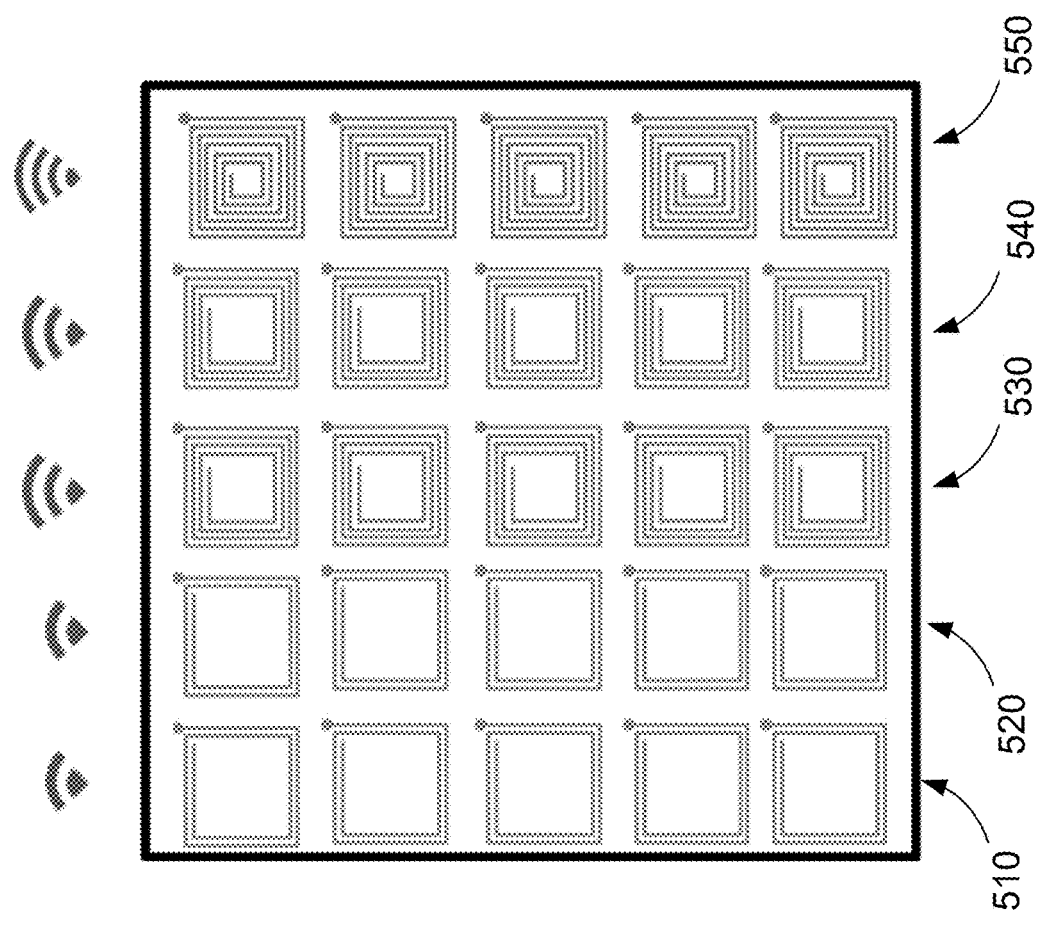
FIG. 5A schematically shows a receiver antenna structure in a single-sided driving display panel according to certain embodiments of the present disclosure.

FIG. 5A schematically shows a receiver antenna structure in a single-sided driving display panel according to certain embodiments of the present disclosure. As shown in FIG. 5A, the receiver antenna structure 400 has five columns of receiver antennas 510, 520, 530, 540 and 550, where the first column of receiver antennas 510 is the closest column to the left side of the receiver antenna structure 500, and the fifth column of receiver antennas 550 is the farthest column from the left side of the receiver antenna structure 500. Further, although not explicitly shown in FIG. 5A, the receiver antenna structure 500 is provided for a single-sided driving display panel, where one or more gate drivers (not shown) is located on the left side of the display panel to transmit the gate signals from left to right. Thus, from the left side of the receiver antenna structure 500, for each of the receiver antennas in the first column of receiver antennas 510 and the second column of receiver antennas 520, the winding number N=2; for each of the receiver antennas in the third column of receiver antennas 530 and the fourth column of receiver antennas 540, the winding number N=4; and for each of the receiver antennas in the fifth column of receiver antennas 550, the winding number N=6. In this case, the induced dB of the receiver antennas in the fifth column 550 will be greater than the induced dB of the receiver antennas in the third and fourth columns 530 and 540, and the induced dB of the receiver antennas in the third and fourth columns 530 and 540 will be greater than the induced dB of the receiver antennas in the first and second columns 510 and 520, thus compensating the IR drop along the gate lines.

Figure 5B:
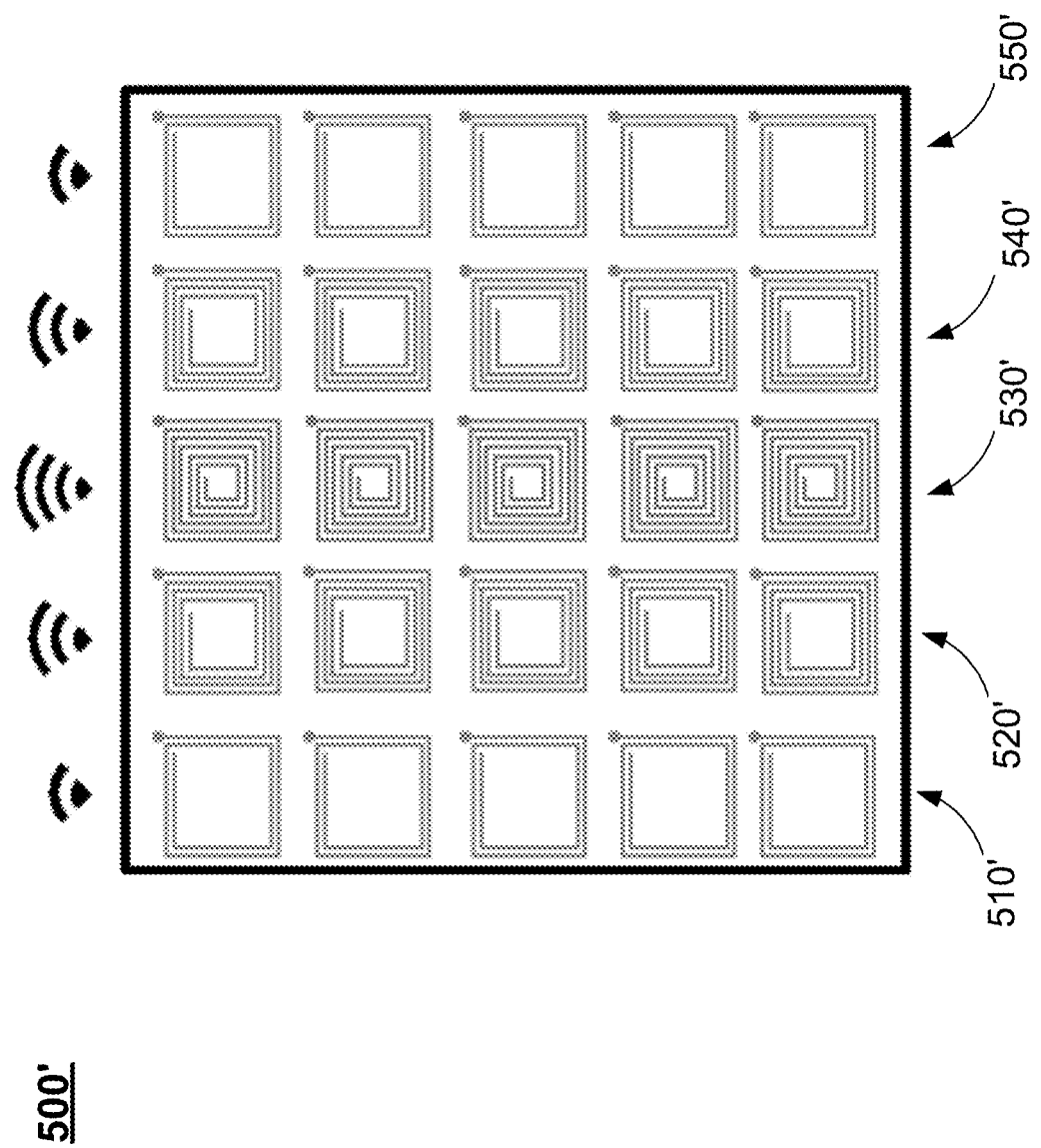
FIG. 5B schematically shows a receiver antenna structure in a double-sided driving display panel according to certain embodiments of the present disclosure.

FIG. 5B schematically shows a receiver antenna structure in a double-sided driving display panel according to certain embodiments of the present disclosure. As shown in FIG. 5B, the receiver antenna structure 500' has five columns of receiver antennas 510', 520', 530', 540' and 550', where the third column of receiver antennas 530' is the center column, and is thus the farthest column from both the left side and the right side of the receiver antenna structure 500'. Further, although not explicitly shown in FIG. 5B, the receiver antenna structure 500' is provided for a double-sided driving display panel, where multiple gate drivers (not shown) are respectively located on both the left and right sides of the display panel to transmit the gate signals from both sides toward a virtual center line of the display panel. Thus, for each of the receiver antennas in the first column of receiver antennas 510' and the fifth column of receiver antennas 520', the winding number N=2; for each of the receiver antennas in the second column of receiver antennas 520' and the fourth column of receiver antennas 540', the winding number N=4; and for each of the receiver antennas in the third column (i.e., the center column) of receiver antennas 530', the winding number N=6. In this case, the induced dB of the receiver antennas in the third column 530' will be greater than the induced dB of the receiver antennas in the second and fourth columns 520' and 540', and the induced dB of the receiver antennas in the second and fourth columns 530' and 540' will be greater than the induced dB of the receiver antennas in the first and fifth columns 510' and 550', thus compensating the IR drop along the gate lines.

It should be noted that the receiver antenna structure 500 as shown in FIG. 5A and the receiver antenna structure 500' as shown in FIG. 5B are provided merely as two embodiments. Although both FIGS. 5A and 5B shows only five columns of receiver antennas, in certain embodiments, the receiver antenna structure of a display panel may include multiple columns of receiver antennas, and the number of columns of receiver antennas may be determined based on the design of the pixel structure of the display panel. Further, in certain embodiments, the winding numbers of the receiver antennas may be different from those as described above, as long as the winding number of each of the receiver antennas of the receiver antenna structure is less than 10, and the winding number of the receiver antennas being electrically connected to the gate lines at locations away from the gate driver is greater than the winding number of the receiver antennas being electrically connected to the gate lines at locations close to the gate driver.

Figure 6:
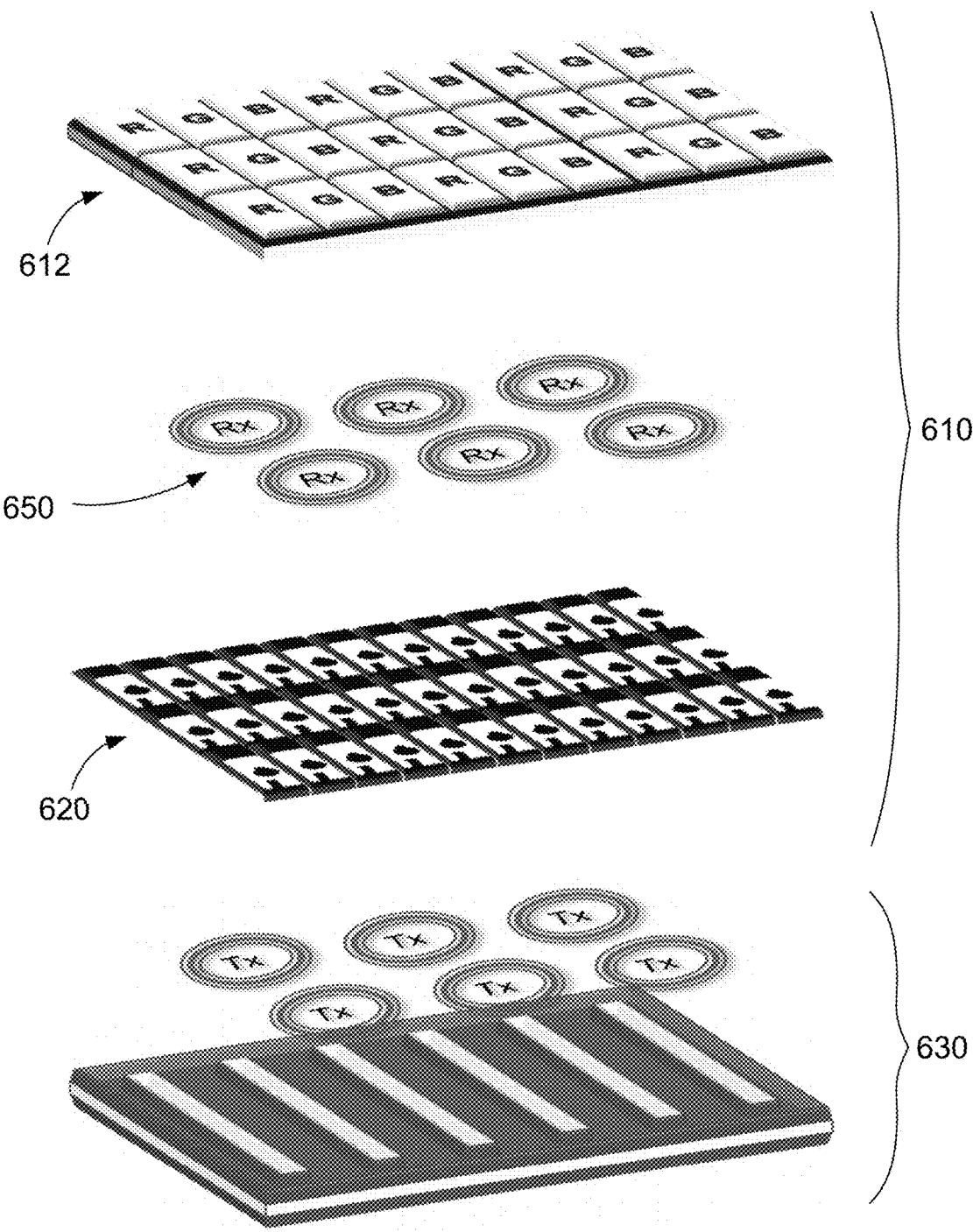
FIG. 6 schematically shows an exploded view of a display panel of a display device according to certain embodiments of the present disclosure.

Further, it should be noted that the features as described above are not limited to the LCD panel 100 as shown in FIG. 1A, and may apply to other types of display panels, such as display panels using light emitting diodes (LEDs) as an active matrix. That is, the display panels use LEDs as sub-pixels. For example, FIG. 6 schematically shows an exploded view of a display panel according to certain embodiments of the present disclosure. As shown in FIG. 6, the display panel 600 is a color micro LED (μLED) display panel, which includes a display cell 610, a transmitter antenna structure 630, and a receiver antenna structure 650. The display cell 610 includes, from the image display side (top side of FIG. 6) toward a back side (bottom side of FIG.

6), a micro LED chip layer 612 and a TFT array 620. The micro LED chip layer 612 includes multiple micro LED chips arranged in an array, where each micro LED chip may emit light in a corresponding RGB color (red, green and blue). Thus, the display cell 610 does not require a color filter layer, and the display panel 600 does not include a backlight module. The receiver antenna structure 650 is formed by a plurality of receiver antennas Rx and is disposed on the TFT array 620. The transmitter antenna structure 650 is formed by a plurality of transmitter antennas Tx, and a distance exists between the transmitter antenna structure 630 and the receiver antenna structure 650 to facilitate high speed wireless data transmission between the transmitter antenna structure 630 and the receiver antenna structure 650.

In the display cell 610, the TFT array 620 and the micro LED chip layer 612 correspondingly define a pixel structure, which corresponds to a display area of the display panel 600. Specifically, the pixel structure includes a plurality of pixels arranged in an array having M columns and N rows, where M and N are positive integers. For each pixel of the pixel structure, a corresponding set of TFTs in the TFT array 620 and a corresponding set of micro LED chips in the micro LED chip layer 612 are provided, where one TFT and one micro LED chip corresponds to one sub-pixel R, G or B of the pixel.

In certain embodiments, the display panel 600 may include other layers or structures not shown in FIG. 6. For example, the TFT array 620 may include a plurality of signal lines, such as the data lines and gate lines. Further, multiple insulating films or layers may be provided in the pixel structure (i.e., the TFT array 620 and the micro LED chip layer 612). Moreover, since there is no backlight module between the TFT array 620 and the transmitter antenna structure 630, other layers or structures may exists between the TFT array 620 and the transmitter antenna structure 630 to prevent the TFT array 620 and the transmitter antenna structure 630 from directly contacting each other.

Figure 7:
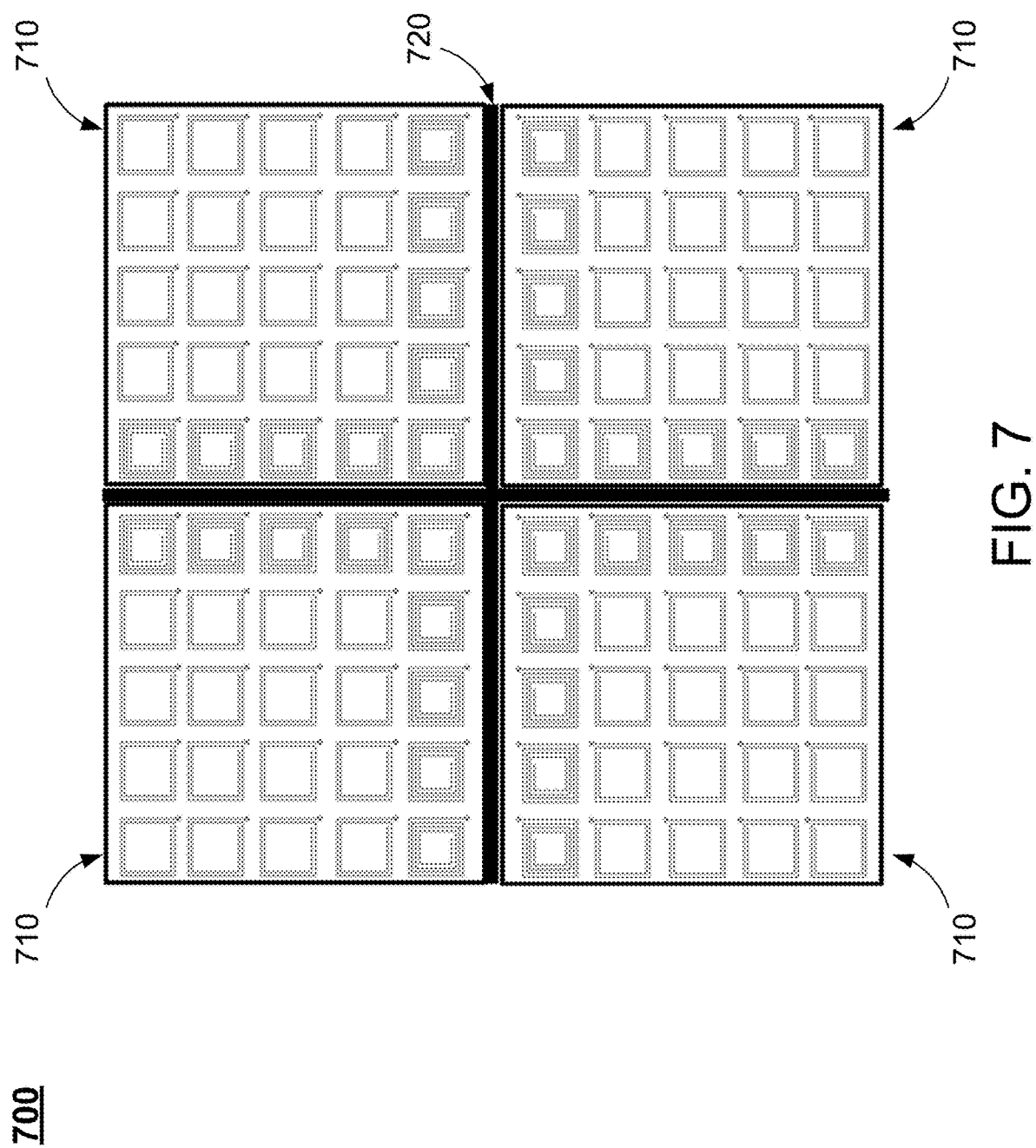
FIG. 7 schematically shows the receiver antenna structure of a tiled micro LED display apparatus according to certain embodiments of the present disclosure.

In certain embodiments, multiple micro LED display panels 600 as shown in FIG. 6 may be utilized and combined to form a tiled micro LED display panel. FIG. 7 schematically shows the receiver antenna structure of a tiled micro LED display apparatus according to certain embodiments of the present disclosure. As shown in FIG. 7, the tiled micro LED display apparatus 700 is formed by four micro LED display panels 710 being joined and spliced together in a 2*2 array, with a cross-shaped splice gap 720 located between the four micro LED display panels 710. Each of the four micro LED display panels 710 has a substantially identical size. In each of the four micro LED display panels 710, the receiver antenna structure has receiver antennas arranged in a 5*5 array. Due to the existence of the splice gap 720 within the display area of the tiled micro LED display apparatus 700, the display signal in the area near the splice gap 720 may be significantly reduced in comparison to display signals in other area away from the splice gap 720. Thus, in each of the four micro LED display panels 710, for the receiver antennas in the rows and columns adjacent to the splice gap 720, the winding number N=4, and for other receiver antennas not adjacent to the splice gap 720, the winding number N=2. In this case, the induced dB of the receiver antennas in the rows and columns adjacent to the splice gap 720 will be greater is greater than the induced dB of the other receiver antennas, thus compensating the signal drop problem in the area near the splice gap 720.

It should be noted that the micro LED display panel 600 and the tiled micro LED display apparatus 700 as described above are merely provided as embodiments of the disclosure. In certain embodiments, the inventive features as described above may also apply to LED display panels or tiled LED display apparatus, without being limited to the use of micro LEDs.

Figure 8A:
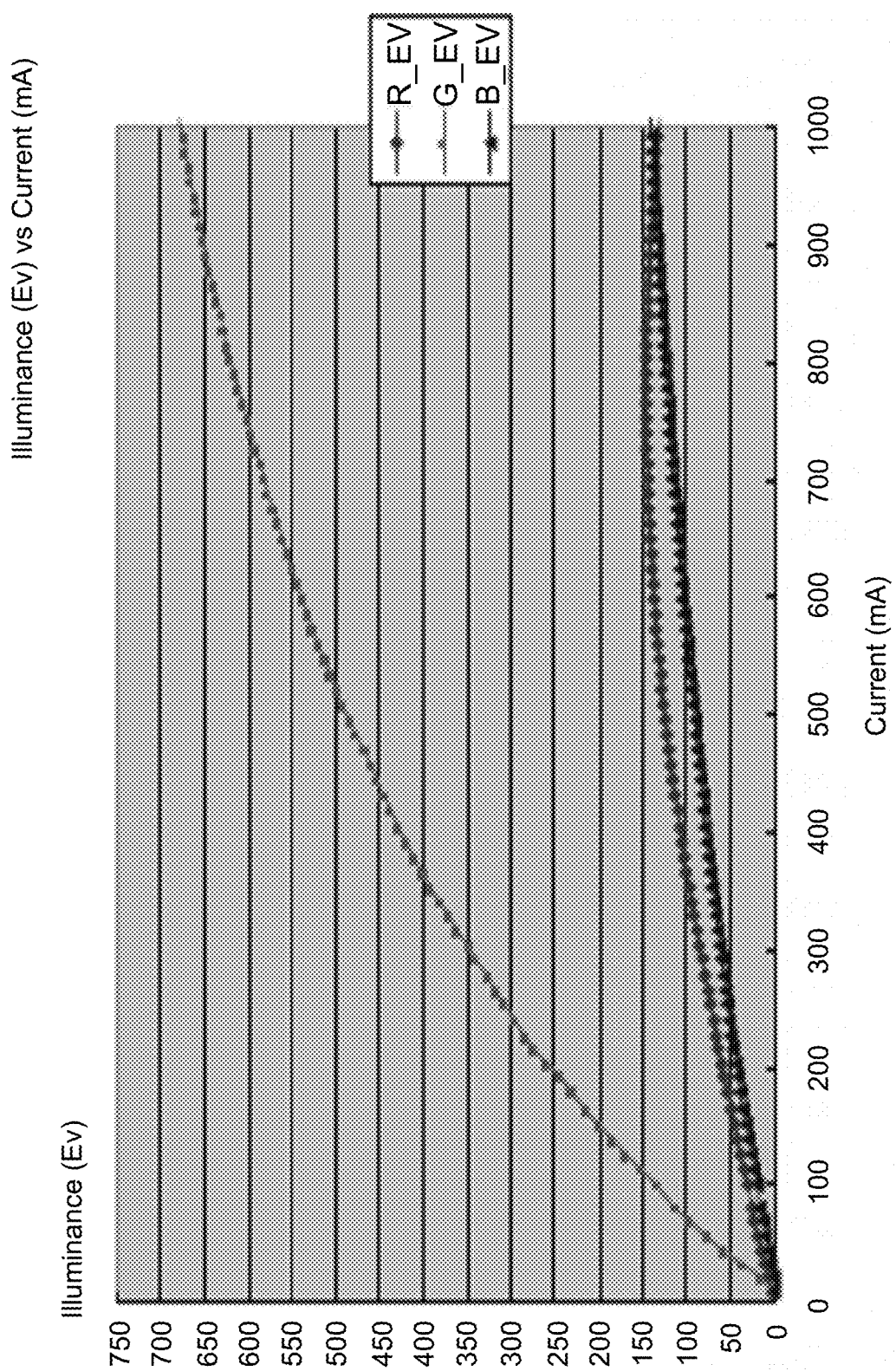
FIG. 8A shows a chart illustrating a relationship between illuminance to current of the micro LED chips in different colors according to certain embodiments of the present disclosure.
Figure 8B:
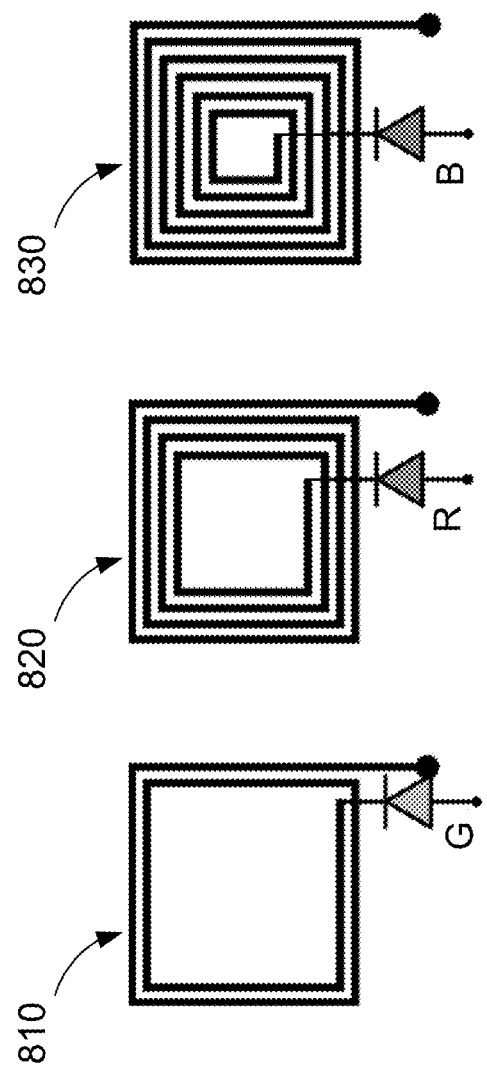
FIG. 8B schematically shows a plurality of receiver antennas corresponding to micro LED chips in different colors according to certain embodiments of the present disclosure.

In certain embodiments, the receiver antenna structure may be designed to compensate illuminances of the micro LEDs. FIG. 8A shows a chart illustrating a relationship between illuminance to current of the micro LED chips in different colors according to certain embodiments of the present disclosure, and FIG. 8B schematically shows a plurality of receiver antennas corresponding to micro LED chips in different colors according to certain embodiments of the present disclosure. As shown in FIG. 8A, at a specific current such as 600 mA, the illuminance of green LEDs is significantly better than the illuminance of red and blue LEDs, and the illuminance of red LEDs is slightly better than the illuminance of blue LEDs. Thus, the induced dB of the receiver antennas for the micro LED chips in different colors may be adjusted correspondingly to adjust the illuminance of the micro LED chips. As shown in FIG. 8B, the receiver antenna 810 is connected to the green micro LED G, which corresponds to a G subpixel; the receiver antenna 820 is connected to the red micro LED R, which corresponds to a R subpixel; and the receiver antenna 830 is connected to the blue micro LED B, which corresponds to a B subpixel. For the receiver antenna 810 being connected to the green micro LED G, the winding number N=2; for the receiver antenna 820 being connected to the red micro LED R, the winding number N=4; and for the receiver antenna 830 being connected to the blue micro LED B, the winding number N=6. In this case, the induced dB of the receiver antenna 830 being connected to the blue micro LED B will be greater than the induced dB of the receiver antenna 820 being connected to the red micro LED R, and the induced dB of the receiver antenna 820 being connected to the red micro LED R will be greater than the induced dB of the receiver antenna 810 being connected to the green micro LED G, thus compensating the illuminance of the blue micro LED B and red micro LED R. Accordingly, the illuminances of the micro LED chips in the RGB colors may be adjusted to be similar to one another.

Figure 9A:
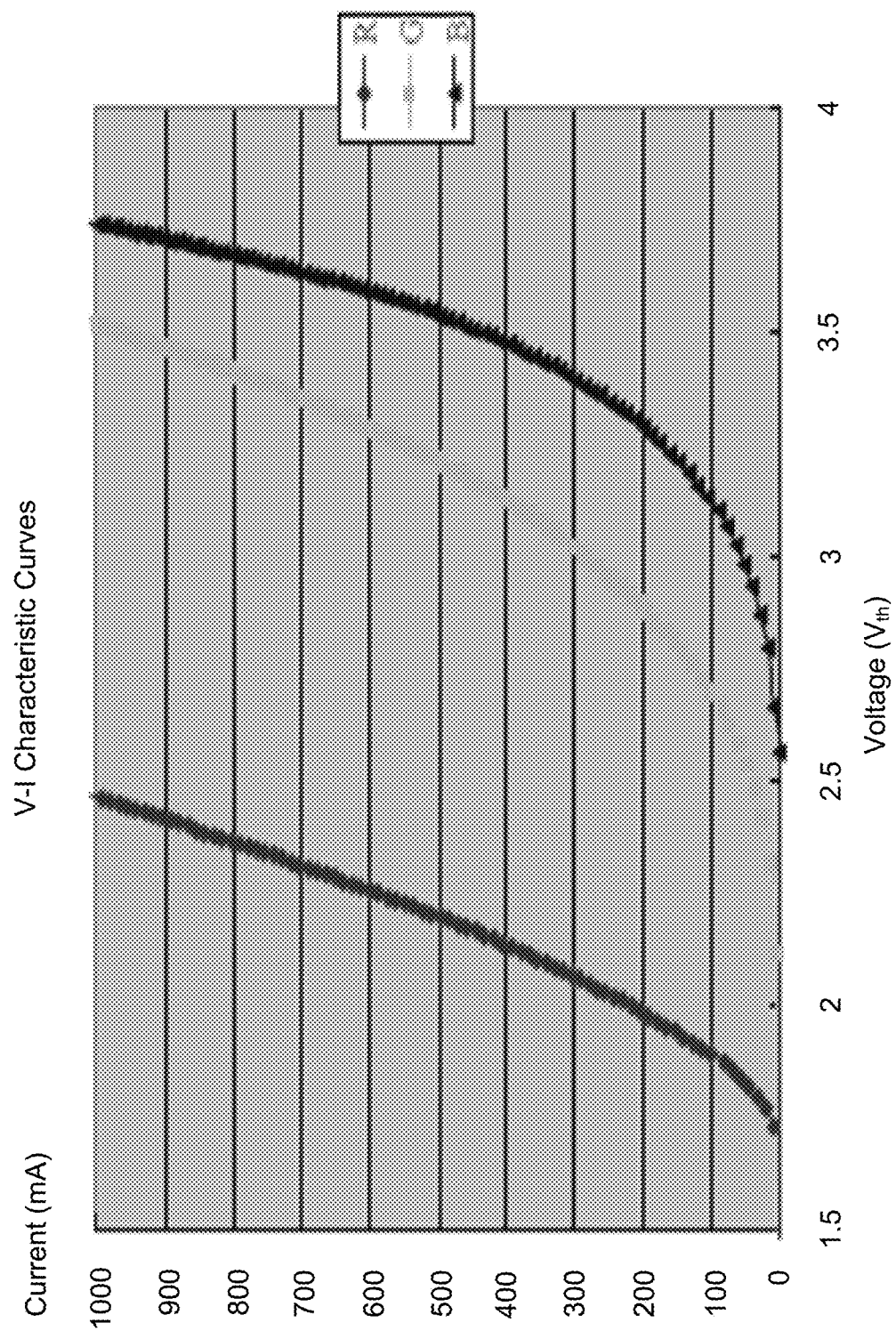
FIG. 9A shows a chart illustrating a relationship between current to voltage of the micro LED chips in different colors according to certain embodiments of the present disclosure.
Figure 9B:
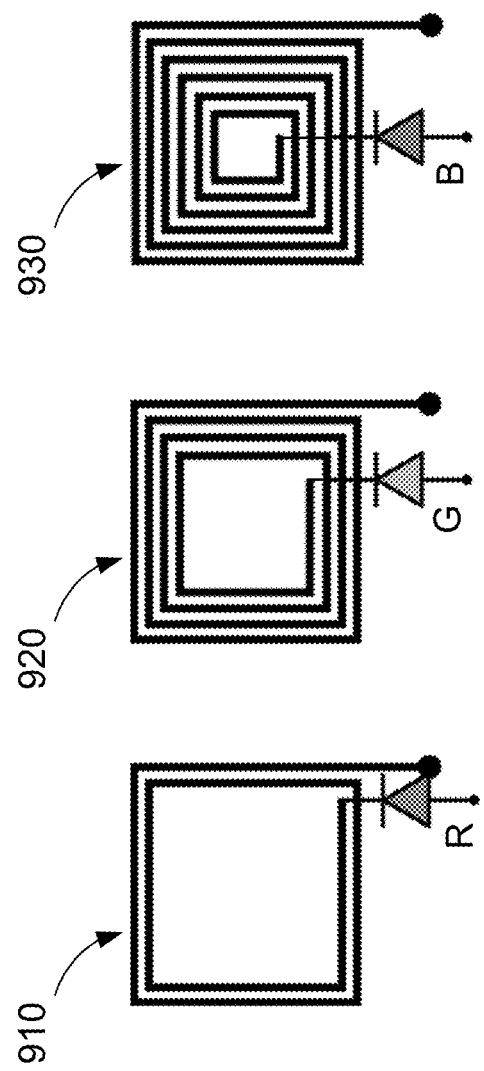
FIG. 9B schematically shows a plurality of receiver antennas corresponding to micro LED chips in different colors according to certain embodiments of the present disclosure.

In certain embodiments, the receiver antenna structure may be designed to compensate threshold voltages of the micro LEDs, as the threshold voltage of a micro LED may relate to the color temperature of the micro LED. FIG. 9A shows a chart illustrating a relationship between current to voltage of the micro LED chips in different colors according to certain embodiments of the present disclosure, and FIG. 9B schematically shows a plurality of receiver antennas corresponding to micro LED chips in different colors according to certain embodiments of the present disclosure. As shown in FIG. 9A, at a specific current such as 600 mA, the threshold voltage Vth of red LEDs is significantly lower than the threshold voltage Vth of green and blue LEDs, and the threshold voltage Vth of green LEDs is slightly lower than the threshold voltage Vth of blue LEDs. Thus, the induced dB of the receiver antennas for the micro LED chips in different colors may be adjusted correspondingly to adjust the threshold voltage Vth of the micro LED chips. As shown in FIG. 9B, the receiver antenna 910 is connected to the red micro LED R, which corresponds to a R subpixel; the receiver antenna 920 is connected to the green micro LED G, which corresponds to a G subpixel; and the receiver antenna 930 is connected to the blue micro LED B, which corresponds to a B subpixel. For the receiver antenna 910 being connected to the red micro LED R, the winding number N=2; for the receiver antenna 920 being connected to the green micro LED G, the winding number N=4; and for the receiver antenna 930 being connected to the blue micro LED B, the winding number N=6. In this case, the induced dB of the receiver antenna 930 being connected to the blue micro LED B will be greater than the induced dB of the receiver antenna 920 being connected to the green micro LED G, and the induced dB of the receiver antenna 920 being connected to the green micro LED G will be greater than the induced dB of the receiver antenna 910 being connected to the red micro LED R, thus compensating the threshold voltage Vth of the blue micro LED B and green micro LED G. Accordingly, the threshold voltages Vth of the data signals being provided to the micro LED chips in the RGB colors may be adjusted to be similar to one another.

In the embodiments as described above, the induced dB of each of the receiver antennas is determined by the winding number of each of the receiver antennas. In other words, the adjustment of the induced dB of the receiver antenna is mainly implemented by changing the winding number of the receiver antenna. However, the induced dB of the receiver antenna may also be adjusted by changing other parameters of the receiver antenna. For example, FIG. 10A schematically shows a plurality of receiver antennas corresponding to micro LED chips in different colors according to certain embodiments of the present disclosure. As shown in FIG. 10A, the receiver antenna 1010 is connected to the blue micro LED B, which corresponds to a B subpixel; the receiver antenna 1020 is connected to the red micro LED R, which corresponds to a R subpixel; and the receiver antenna 1030 is connected to the green micro LED G, which corresponds to a G subpixel. For the receiver antenna 1010 being connected to the blue micro LED B, the winding number N=2; and for the receiver antenna 1020 being connected to the red micro LED R and the receiver antenna 1030 being connected to the green micro LED G, the winding number N=1. Further, the receiver antenna 1010 being connected to the blue micro LED B surrounds the receiver antenna 1020 being connected to the red micro LED R and the receiver antenna 1030 being connected to the green micro LED G, and the receiver antenna 1020 being connected to the red micro LED R surrounds the receiver antenna 1030 being connected to the green micro LED G, such that the inner diameter of the receiver antenna 1010 is greater than the outer diameter of each of the receiver antennas 1020 and 1030, and the inner diameter of the receiver antenna 1020 is greater than the outer diameter of the receiver antenna 1030. In this case, the induced dB of the receiver antenna 1010 being connected to the blue micro LED B will be greater than the induced dB of the receiver antenna 1020 being connected to the red micro LED R, and the induced dB of the receiver antenna 1020 being connected to the red micro LED R will be greater than the induced dB of the receiver antenna 1030 being connected to the green micro LED G, thus compensating thus compensating the illuminance of the blue micro LED B and red micro LED R. Accordingly, the illuminances of the micro LED chips in the RGB colors may be adjusted to be similar to one another.

Figure 10B:
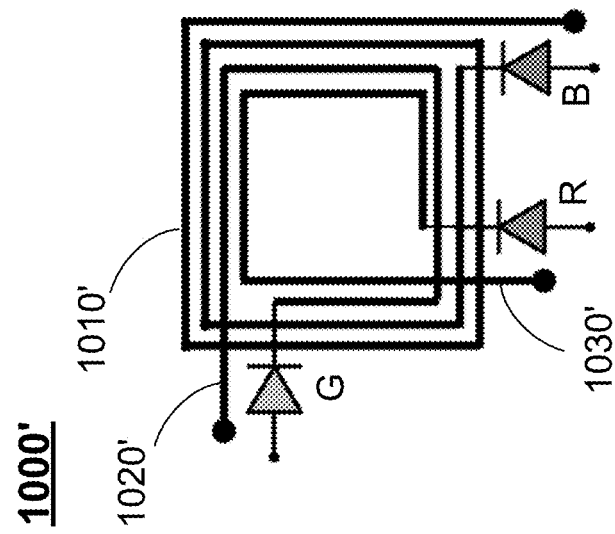
FIG. 10B schematically shows a plurality of receiver antennas corresponding to micro LED chips in different colors according to certain embodiments of the present disclosure.
Figure 10A:
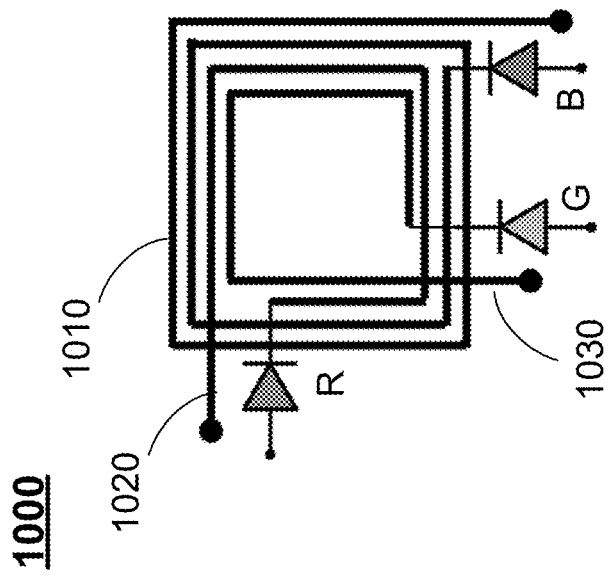
FIG. 10A schematically shows a plurality of receiver antennas corresponding to micro LED chips in different colors according to certain embodiments of the present disclosure.

FIG. 10B schematically shows a plurality of receiver antennas corresponding to micro LED chips in different colors according to certain embodiments of the present disclosure. As shown in FIG. 10B, the receiver antenna 1010' is connected to the blue micro LED B, which corresponds to a B subpixel; the receiver antenna 1020' is connected to the green micro LED G, which corresponds to a G subpixel; and the receiver antenna 1030' is connected to the red micro LED R, which corresponds to a R subpixel. For the receiver antenna 1010' being connected to the blue micro LED B, the winding number N=2; and for the receiver antenna 1020' being connected to the green micro LED G and the receiver antenna 1030' being connected to the red micro LED R, the winding number N=1. Further, the receiver antenna 1010' being connected to the blue micro LED B surrounds the receiver antenna 1020' being connected to the green micro LED G and the receiver antenna 1030' being connected to the red micro LED R, and the receiver antenna 1020' being connected to the green micro LED G surrounds the receiver antenna 1030' being connected to the red micro LED R, such that the inner diameter of the receiver antenna 1010' is greater than the outer diameter of each of the receiver antennas 1020' and 1030', and the inner diameter of the receiver antenna 1020' is greater than the outer diameter of the receiver antenna 1030'. In this case, the induced dB of the receiver antenna 1010' being connected to the blue micro LED B will be greater than the induced dB of the receiver antenna 1020' being connected to the green micro LED G R, and the induced dB of the receiver antenna 1020' being connected to the green micro LED G will be greater than the induced dB of the receiver antenna 1030' being connected to the red micro LED R, thus compensating the threshold voltage Vth of the blue micro LED B and green micro LED G. Accordingly, the threshold voltages Vth of the data signals being provided to the micro LED chips in the RGB colors may be adjusted to be similar to one another.

In certain embodiments, it is also applicable that the induced dB of each of the receiver antennas can be determined by the line thickness of each of the receiver antennas. In this case, the line thickness of at least one of the receiver antennas is greater than the line thickness of other ones of the receiver antennas. Specifically, The inventors have performed simulations based on the change of the line thickness of the receiver antennas and obtained the results as shown in the following Table:

| Thickness of Rx(um) | Induced dB of Rx |
|---|---|
| 3 | −6.05 |
| 5 | −5.06 |
| 10 | −4.10 |
| 20 | −3.60 |
| 30 | −3.42 |

As shown in the Table, when the thickness T of a receiver antenna Rx increases, the induced dB of the receiver antenna Rx is improved.

Figure 11:
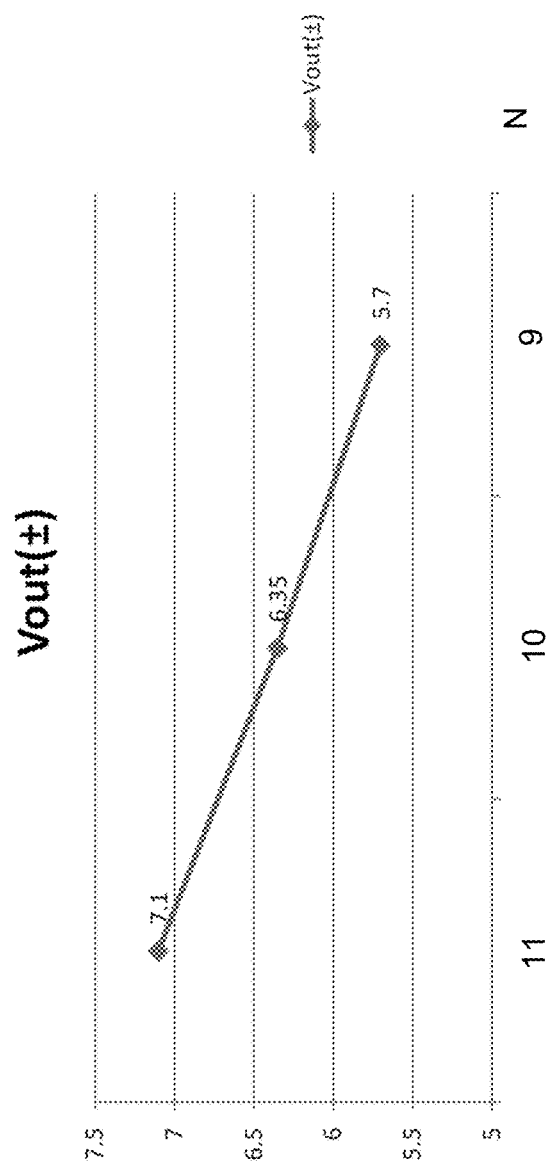
FIG. 11 shows a chart illustrating a relationship between voltage to winding number of a receiver antenna according to certain embodiments of the present disclosure.

As described above, the induced dB of an receiver antenna can be determined by one or more parameters of the receiver antenna, including the winding number N, the outer diameter D, the inner diameter d, the line pitch P, the line width W, and the line thickness T of the receiver antenna. In determining the value of these parameters, a factor to be considered is the voltage received by the receiver antenna from the corresponding transmitter antenna. For example, FIG. 11 shows a chart illustrating a relationship between voltage to winding number of a receiver antenna according to certain embodiments of the present disclosure. As shown in FIG. 11, for a same corresponding transmitter antenna, the voltage Vout received by the receiver antennas may be determined by the winding numbers N of the receiver antennas, where the voltage Vout is 7.1 V when N=11, 6.35 V when N=10, and 5.7 V when N=9. In other words, there is a trend that reducing the winding number N of the receiver antenna will result in a reduced voltage Vout of the receiver antenna.

The embodiments of the display panel and display apparatus as described above are provided for the purposes of illustration and description. Although certain features may be described in different embodiments respectively, these features may be combined altogether to form other embodiments without departing from the spirit and scope of the disclosure.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A display panel, comprising:
   a pixel structure corresponding to a display area, comprising a plurality of pixels arranged in an array having M columns and N rows, wherein M and N are positive integers; and
   a receiver antenna structure disposed on the pixel structure, configured to provide first signals to the pixels, wherein the receiver antenna structure comprises a plurality of receiver antennas, each of the receiver antennas corresponds to at least one of the M columns and at least one of the N rows of the pixels and has an induced decibel (dB);
   wherein for each of the receiver antennas, the induced dB is determined by a plurality of parameters of the receiver antenna, and the parameters comprise:
   a winding number of the receiver antenna;
   an outer diameter of the receiver antenna;
   an inner diameter of the receiver antenna;
   a line pitch of the receiver antenna;
   a line width of the receiver antenna; and
   a line thickness of the receiver antenna;
   wherein the induced dB of at least one of the receiver antennas is greater than the induced dB of other ones of the receiver antennas;
   wherein each of the receiver antennas has an identical outer diameter, an identical line pitch, an identical line width and an identical line thickness, the induced dB of each of the receiver antennas is determined by the winding number of each of the receiver antennas, and the winding number of at least one of the receiver antennas is greater than the winding number of other ones of the receiver antennas.

2. The display panel of claim 1, wherein the pixel structure further comprises a plurality of data lines, each of the receiver antennas is electrically connected to one of the data lines, and each of the pixels in a same column of the M columns of the pixel array is connected to a same one of the data lines.

3. The display panel of claim 2, wherein each of the receiver antennas has an outer feeding end and an inner feeding end, and each of the receiver antennas is electrically connected to the corresponding one of the data lines at one of the outer feeding end and the inner feeding end thereof.

4. The display panel of claim 1, wherein the pixel structure further comprises a plurality of gate lines, each of the pixels in a same row of the N rows of the pixel array is electrically connected to a same one of the gate lines, and each of the gate lines is electrically connected to a gate driver; and
   the receiver antennas comprise a plurality of first receiver antennas corresponding to the pixels being electrically connected to the gate lines at locations away from the gate driver and a plurality of second receiver antennas corresponding to the pixels being electrically connected to the gate lines at locations close to the gate driver, and the winding number of each of the first receiver antennas is greater than the winding number of each of the second receiver antennas.

5. The display panel of claim 1, further comprising a LED chip layer comprising a plurality of LED chips arranged in a LED array, wherein each of the pixels comprises three subpixels, comprising a red (R) subpixel, a green (G) subpixel and a blue (B) subpixel, and each of the LED chips corresponds to one of the subpixels of the pixels.

6. The display panel of claim 5, wherein:
   the receiver antennas comprises a plurality of first receiver antennas corresponding to the R subpixels of the pixels, a plurality of second receiver antennas corresponding to the G subpixels of the pixels, and a plurality of third receiver antennas corresponding to the B subpixels of the pixels; and
   the winding number of each of the third receiver antennas is greater than the winding number of each of the first receiver antennas and the second receiver antennas.

7. The display panel of claim 6, wherein the winding number of each of the first receiver antennas is greater than the winding number of each of the second receiver antennas.

8. The display panel of claim 6, wherein the winding number of each of the second receiver antennas is greater than the winding number of each of the first receiver antennas.

9. The display panel of claim 5, wherein:
   the receiver antennas comprises a plurality of first receiver antennas corresponding to the R subpixels of the pixels, a plurality of second receiver antennas corresponding to the G subpixels of the pixels, and a plurality of third receiver antennas corresponding to the B subpixels of the pixels; and
   for the first, second and third receiver antennas corresponding to the subpixels of a same pixel, the inner diameter of the third receiver antenna is greater than the outer diameter of the first receiver antenna and the outer diameter of the second receiver antenna.

10. The display panel of claim 9, wherein for the first, second and third receiver antennas corresponding to the subpixels of the same pixel, the winding number of the third receiver antenna is greater than the winding number of each of the first receiver antenna and the second receiver antenna.

11. The display panel of claim 9, wherein for the first, second and third receiver antennas corresponding to the subpixels of the same pixel, the inner diameter of the first receiver antenna is greater than the outer diameter of the second receiver antenna.

12. The display panel of claim 9, wherein for the first, second and third receiver antennas corresponding to the subpixels of the same pixel, the inner diameter of the first receiver antenna is greater than the outer diameter of the second receiver antenna.

13. A display panel, comprising:
   a pixel structure corresponding to a display area, comprising a plurality of pixels arranged in an array having M columns and N rows, wherein M and N are positive integers; and
   a receiver antenna structure disposed on the pixel structure, configured to provide first signals to the pixels, wherein the receiver antenna structure comprises a plurality of receiver antennas, each of the receiver antennas corresponds to at least one of the M columns and at least one of the N rows of the pixels and has an induced decibel (dB);
   wherein for each of the receiver antennas, the induced dB is determined by a plurality of parameters of the receiver antenna, and the parameters comprise:
      a winding number of the receiver antenna;
      an outer diameter of the receiver antenna;
      an inner diameter of the receiver antenna;
      a line pitch of the receiver antenna;
      a line width of the receiver antenna; and
      a line thickness of the receiver antenna;
   wherein the induced dB of at least one of the receiver antennas is greater than the induced dB of other ones of the receiver antennas;
   wherein each of the receiver antennas has an identical outer diameter, an identical inner diameter, an identical line pitch, an identical line width and an identical winding number, and the induced dB of each of the receiver antennas is determined by the line thickness of each of the receiver antennas; and
   wherein the line thickness of at least one of the receiver antennas is greater than the line thickness of other ones of the receiver antennas.

14. The display panel of claim 13, wherein the pixel structure further comprises a plurality of data lines, each of the receiver antennas is electrically connected to one of the data lines, and each of the pixels in a same column of the M columns of the pixel array is connected to a same one of the data lines.

15. The display panel of claim 14, wherein each of the receiver antennas has an outer feeding end and an inner feeding end, and each of the receiver antennas is electrically connected to the corresponding one of the data lines at one of the outer feeding end and the inner feeding end thereof.

16. A tiled micro light-emitting diode (LED) display apparatus, comprising:
   a plurality of micro LED display panels arranged in tiles, wherein gaps are formed between adjacent ones of the micro LED display panels;
   wherein each of the micro LED display panels comprises:
      a pixel structure corresponding to a display area, comprising a plurality of pixels arranged in a pixel array having M columns and N rows, wherein M and N are positive integers;
      a micro LED chip layer comprising a plurality of micro LED chips arranged in a micro LED array, wherein each of the micro LED chips corresponds to one of the pixels; and
      a receiver antenna structure disposed on the pixel structure, configured to provide first signals to the pixels, wherein the receiver antenna structure comprises a plurality of receiver antennas arranged in an antenna array, and each of the receiver antennas corresponds to at least one of the M columns and at least one of the N rows of the pixels and has an induced decibel (dB);
      wherein for each of the receiver antennas, the induced dB is determined by a plurality of parameters of the receiver antenna;
   wherein for each of the micro LED display panels, the receiver antennas in the antenna array comprises first receiver antennas located near the gaps and second receiver antennas located away from the gaps, and the induced dB of each of the first receiver antennas is greater than the induced dB of each of the second receiver antennas;
   wherein each of the receiver antennas has an identical outer diameter, an identical line pitch, an identical line width and an identical line thickness, the induced dB of each of the receiver antennas is determined by the winding number of each of the receiver antennas, and the winding number of each of the first receiver antennas is greater than the winding number of each of the second receiver antennas.

17. The tiled micro LED display apparatus of claim 16, wherein the parameters comprise:
   the winding number of the receiver antenna;
   an outer diameter of the receiver antenna;
   an inner diameter of the receiver antenna;
   a line pitch of the receiver antenna;
   a line width of the receiver antenna; and
   a line thickness of the receiver antenna.

18. The tiled micro LED display apparatus of claim 16, wherein for each of the micro LED display panels, the first receiver antennas are the receiver antennas located on at least one outermost column or located on at least one outermost row of the antenna array adjacent to the gaps.

19. The tiled micro LED display apparatus of claim 16, wherein for each of the micro LED display panels, the pixel structure further comprises a plurality of data lines, each of the receiver antennas is electrically connected to one of the data lines, and each of the pixels in a same column of the M columns of the pixel array is connected to a same one of the data lines.

20. The tiled micro LED display apparatus of claim 19, wherein each of the receiver antennas has an outer feeding end and an inner feeding end, and each of the receiver antennas is electrically connected to the corresponding one of the data lines at one of the outer feeding end and the inner feeding end thereof.

* * * * *